United States Patent
Kasai et al.

(10) Patent No.: US 11,632,859 B2
(45) Date of Patent: Apr. 18, 2023

(54) LONG LAMINATE, METHOD FOR ITS PRODUCTION AND PRINTED WIRING BOARD

(71) Applicant: AGC Inc., Chiyoda-ku (JP)

(72) Inventors: Wataru Kasai, Chiyoda-ku (JP); Tomoya Hosoda, Chiyoda-ku (JP); Atsumi Yamabe, Chiyoda-ku (JP)

(73) Assignee: AGC Inc., Chiyoda-ku (JP)

( * ) Notice: Subject to any disclaimer, the term of this patent is extended or adjusted under 35 U.S.C. 154(b) by 224 days.

(21) Appl. No.: 16/911,492

(22) Filed: Jun. 25, 2020

(65) Prior Publication Data

US 2020/0329558 A1  Oct. 15, 2020

Related U.S. Application Data

(63) Continuation of application No. PCT/JP2019/000948, filed on Jan. 15, 2019.

(30) Foreign Application Priority Data

| Jan. 18, 2018 | (JP) | JP2018-006772 |
| Apr. 16, 2018 | (JP) | JP2018-078253 |
| Aug. 31, 2018 | (JP) | JP2018-163696 |

(51) Int. Cl.
 *H05K 1/03* (2006.01)
 *H05K 1/09* (2006.01)

(52) U.S. Cl.
 CPC ............. *H05K 1/036* (2013.01); *H05K 1/092* (2013.01); *H05K 2201/015* (2013.01);
 (Continued)

(58) Field of Classification Search
 CPC .......................................... H05K 1/0313–0373
 See application file for complete search history.

(56) References Cited

U.S. PATENT DOCUMENTS

| 4,824,511 A | 4/1989 | Hartman et al. |
| 6,284,657 B1 * | 9/2001 | Chooi ............... H01L 21/76807 438/638 |
| 2016/0242274 A1 | 8/2016 | Hosoda et al. |

FOREIGN PATENT DOCUMENTS

| CN | 101284910 A | 10/2008 |
| JP | 2006-054357 A | 2/2006 |

(Continued)

OTHER PUBLICATIONS

Asahi Glass LTD, Machine Translation of WO 2015080260, 2015 (Year: 2015).*

(Continued)

*Primary Examiner* — Jeremy C Norris
(74) *Attorney, Agent, or Firm* — Element IP, PLC

(57) ABSTRACT

Provided is a long laminate for a printed wiring board, which has reduced thickness of a resin layer and increased signal transmission speed, and which, while being excellent in dimensional stability and folding endurance, has no wrinkles in a fluororesin layer. The long laminate contains a metal layer of a long metal foil, a fluororesin layer containing a fluororesin and contacting the metal layer, and a heat-resistant resin layer containing a heat-resistant resin and contacting the fluororesin layer. Each fluororesin layer is 1 to 10 μm thick. The ratio of the total thickness of the fluororesin layer to the total thickness of the heat-resistant resin layer is 0.3 to 3.0. The sum of the total thickness of the fluororesin layer and the total thickness of the heat-resistant resin layer is at most 50 μm. Also provided are a method for producing the long laminate, and the printed wiring board.

9 Claims, 3 Drawing Sheets

(52) U.S. Cl.
CPC ............ *H05K 2201/0154* (2013.01); *H05K 2201/0355* (2013.01); *H05K 2201/0358* (2013.01)

(56) References Cited

FOREIGN PATENT DOCUMENTS

| | | |
|---|---|---|
| JP | 2016-087799 A | 5/2016 |
| JP | 2017-002115 A | 1/2017 |
| JP | 2017-136755 A | 8/2017 |
| TW | 201730011 A | 9/2017 |
| WO | WO 2010/084867 A1 | 7/2010 |
| WO | WO 2015/080260 A1 | 6/2015 |
| WO | WO 2016/104297 A1 | 6/2016 |

OTHER PUBLICATIONS

International Search Report dated Mar. 19, 2019 in PCT/JP2019/000948 filed on Jan. 15, 2019, 2 pages.

* cited by examiner

Coverlay film 120

(Unit: mm)

LONG LAMINATE, METHOD FOR ITS PRODUCTION AND PRINTED WIRING BOARD

TECHNICAL FIELD

The present invention relates to a long laminate comprising a metal layer made of a metal foil and resin layers, a method for its production and a printed wiring board.

BACKGROUND ART

A laminate having a metal layer made of a metal foil and a resin layer (such as a copper-clad laminate) is used as a printed wiring board by processing the metal layer by etching, etc. Along with reduction of the size and increase of the communication capacity of electronic devices, it is required for the printed wiring board to reduce the thickness of the resin layer corresponding to the reduction of the size and to increase the speed of signal transmission corresponding to the increase of the capacity.

If the resin layer is thinned, in order to match the impedance, the width of the conductor circuit becomes thin. Therefore, the resistance of the conductor circuit tends to increase, whereby it becomes difficult to increase the speed of signal transmission. In order to widen the width of the conductor circuit at the same time as thinning the resin layer, it is necessary to use a material having low relative permittivity and dissipation factor, for the resin layer.

A fluororesin is, since its relative permittivity and dissipation factor are low, considered to be an ideal material as a material for the resin layer of a printed wiring board intended to increase the speed of signal transmission. However, the fluororesin film is low in dimensional stability at high temperatures, as compared to a heat-resistant resin film, such as a conventional polyimide film. Therefore, as a long laminate for a printed wiring board to satisfy both the high speed of the signal transmission and dimensional stability, a laminate has been proposed wherein a resin layer is formed by laminating a fluororesin film and a heat-resistant resin film (Patent Documents 1 and 2).

PRIOR ART DOCUMENTS

Patent Documents

Patent Document 1: WO 2016/104297
Patent Document 2: JP-A-2016-87799

DISCLOSURE OF INVENTION

Technical Problem

The long laminate disclosed in Patent Documents 1 and 2 is produced by a method of laminating a long fluororesin film and a long metal foil or heat resistant resin film conveyed by roll-to-roll, by passing them through a pair of metal rolls. However, in the method described in Patent Documents 1 and 2, since the stiffness and dimensional stability of the fluororesin film are low, wrinkles are likely to occur in the fluororesin layer made of a fluororesin film, after the lamination, as the fluororesin film is thin. Therefore, in the long laminate to be produced by using the fluororesin film, there is a limit in thinning the resin layer. And, when it is not possible to thin the resin layer, there will be such a problem that folding endurance of a flexible printed wiring board will be lowered.

The present invention is to provide a long laminate capable of obtaining a printed wiring board which is capable of satisfying both thinning of the resin layer and speeding up of the signal transmission, which is excellent in dimensional stability and folding endurance and which has no wrinkles in the fluororesin layer; a method capable of producing a long laminate having a thin film fluororesin layer having no wrinkles; and a printed wiring board which is capable of satisfying both thinning of the resin layer and speeding up of the signal transmission, which excellent in dimensional stability and folding endurance and which has no wrinkles in the fluororesin layer.

Solution to Problem

The present invention has the following embodiments.
[1] A long laminate characterized by comprising at least one metal layer made of a long metal foil, at least one fluororesin layer in contact with the metal layer, and at least one heat-resistant resin layer in contact with the fluororesin layer, wherein the thickness per one fluororesin layer is from 1 to 10 μm, the ratio of the total thickness of the fluororesin layer to the total thickness of the heat-resistant resin layer is from 0.3 to 3.0, and the total thickness of the fluororesin layer and the heat-resistant resin layer is at most 50 μm.
[2] The long laminate according to [1], wherein the fluororesin layer is composed mainly of a fluororesin.
[3] The long laminate according to [1] or [2], wherein the fluororesin layer contains a dispersing agent, and the proportion of the dispersing agent contained in the fluororesin layer is less than 2.0 mass %, to the fluororesin layer.
[4] The long laminate according to any one of [1] to [3], wherein the melting point of the fluororesin is at least 270° C.
[5] The long laminate according to any one of [1] to [4], wherein the fluororesin has at least one type of functional group selected from the group consisting of a carbonyl group-containing group, a hydroxy group, an epoxy group, an amide group, an amino group and an isocyanate group.
[6] The long laminate according to any one of [1] to [5], wherein the total thickness of the fluororesin layer and the heat-resistant resin layer is at most 25 μm.
[7] A printed wiring board made by processing the long laminate as defined in any one of [1] to [6].
[8] A method for producing a long laminate comprising at least one metal layer made of a long metal foil, at least one fluororesin layer in contact with the metal layer, and at least one heat-resistant resin layer in contact with the fluororesin layer, characterized in that, while conveying a long metal foil or long heat-resistant resin film, the following liquid composition is applied to the metal foil or heat-resistant resin film to form a wet film, and while conveying the formed long wet film-coated metal foil or long wet film-coated heat-resistant resin film, the wet film is heated to remove the following liquid medium and to melt the following resin powder, to form a fluororesin layer, to obtain a fluororesin layer-coated metal foil or fluororesin layer-coated heat-resistant resin film, and, in the case where the fluororesin layer-coated metal foil is obtained, laminating the fluororesin layer-coated metal foil and a substrate containing a long heat-resistant resin film, so that the fluororesin layer and the heat-resistant resin film are in contact, or in the case where the fluororesin layer-coated heat-resistant resin film is obtained, laminating the fluororesin layer-coated heat resistant resin film and a substrate containing a long metal foil, so that the fluororesin layer of the fluororesin layer-coated heat resistant resin film and the metal foil are in contact:

Liquid composition: a liquid composition comprising a liquid medium, and a resin powder and a dispersing agent, dispersed in the liquid medium, in which the resin powder is composed mainly of a fluororesin.

[9] The production method according to [8], wherein the fluororesin layer-coated metal foil and the substrate containing the heat-resistant resin film are laminated by passing them between a pair of metal rolls or a pair of endless belts.

[10] The production method according to [8], wherein the fluororesin layer-coated heat-resistant resin film and the substrate containing the metal foil are laminated by passing them between a pair of metal rolls or a pair of endless belts.

[11] The production method according to any one of [8] to [10], wherein in the fluororesin layer-coated metal foil and the fluororesin layer-coated heat-resistant resin film, the proportion of the dispersing agent contained in the fluororesin layer is less than 2.0 mass % to the fluororesin layer.

[12] The production method according to any one of [8] to [11], wherein in the fluororesin layer-coated metal foil and the fluororesin layer-coated heat-resistant resin film, the ten-point average roughness $Rz_{JIS}$ of the surface of the fluororesin layer is from 0.05 to 3.0 µm.

[13] The production method according to any one of [8] to [12], wherein, of the heat-resistant resin film, the water contact angle of the surface is from 5° to 60°, as measured by the sessile drop method stipulated in JIS R 3257: 1999.

[14] The production method according to any one of [8] to [13], wherein the heat-resistant resin film is a film surface-treated by atmospheric pressure plasma treatment or vacuum plasma treatment.

Advantageous Effects of Invention

According to the long laminate of the present invention, it is possible to obtain a printed wiring board which is capable of satisfying both thinning of the resin layer and speeding up of the signal transmission, which is excellent in dimensional stability and folding endurance of the resin layer and which has no wrinkles in the fluororesin layer.

According to the method for producing a long laminate of the present invention, it is possible to produce a long laminate having a thin film fluororesin layer having no wrinkles.

The printed wiring board of the present invention is capable of satisfying both thinning of the resin layer and speeding up of the signal transmission, is excellent in dimensional stability and folding endurance of the resin layer, and has no wrinkles in the fluororesin layer.

DESCRIPTION OF EMBODIMENTS

Figure 1:
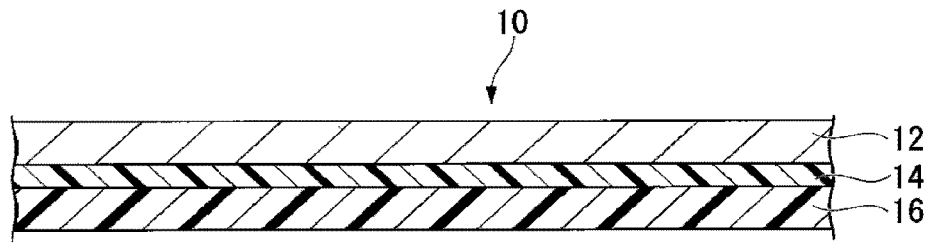
FIG. 1 is a cross-sectional view showing an example of a long laminate of the present invention.

The following terms have the following meanings.

A "heat-resistant resin" means a resin, of which the tensile modulus (JIS K 7161-1: 2014, ISO 527-1: 2012) at the lowest temperature of 260° C. in the solder reflow process is at least 108 Pa.

A "melt-moldable" resin means a resin whereby there is a temperature at which MFR becomes to be from 0.01 to 1,000 g/10 min. at a temperature higher by at least 20° C. than the melting point of the resin under a condition of a load of 49N.

"MFR" is a melt mass flow rate, which is defined in JIS K 7210-1: 2014 (corresponding international standard ISO 1133-1: 2011).

A "unit based on a monomer" is a generic term for an atomic group directly formed by polymerization of a monomer and an atomic group obtainable by chemically converting a part of the atomic group. In this specification, units based on a monomer, may simply be referred to also as "units".

The "melting point" is the temperature corresponding to the maximum value at the melting peak of the resin as measured by a differential scanning calorimetry (DSC) method.

The "ten-point average roughness ($Rz_{JIS}$)" is a value defined in Annex JA of JIS B 0601:2013.

The "wetting tension" is a value measured in accordance with JIS K 6768: 1999 (corresponding international standard ISO 8296: 1987). In measurement of the wetting tension, a cotton swab dipped in a test fluid having a known wetting tension is rubbed quickly on a test specimen to form a liquid film of 6 cm$^2$, whereupon the state of the liquid film after 2 seconds from the application is observed, whereby no breaking being observed is judged to be wetting. The maximum wetting tension where no breaking of the liquid film is observed, is taken as the wetting tension of the test specimen. Here, the lower limit of the wetting tension of the test liquid as defined by JIS K 6768: 1999 is 22.6 mN/m.

The "adhesive strength" is a value measured as follows. From along laminate, a rectangular test specimen having a length of 100 mm and a width of 10 mm is cut out. The heat resistant resin layer is peeled from the fluororesin layer from one end in the longitudinal direction of the test specimen to a position of 50 mm. Taking the position of 50 mm from one end in the longitudinal direction of the test specimen at the center, 90 degree peeling is conducted at a tensile rate of 50 mm/min by using a tensile tester, whereby the average load in the measured distance of from 10 mm to 30 mm is taken as the adhesive strength (N/10 mm).

The "dimensional change rate" is a dimensional change rate between before etching and after etching and heating of the long laminate, obtained by the test method as defined in JIS C 6471: 1995 (corresponding international standard IEC 249-1: 1982).

The "specific permittivity" of the fluororesin is a value to be measured at a frequency of 2.5 GHz in an environment within ranges of 23° C.±2° C. and RH 50±5% by the SPDR (Spirit post dielectric resonator) method.

The "specific permittivity" of the resin layer is a value to be measured at a frequency 10 GHz using a Fabry-Perot resonator and a vector network analyzer, with respect to the resin layer having the metal layer removed by etching from the laminate.

The "folding endurance" is the number of folding times until breakage of a conductor circuit, obtained by the test method as defined in JIS C 6471: 1995 (corresponding international standard IEC 249-1: 1982).

The "proportion of the dispersing agent" contained in the fluororesin layer is obtained as follows.

From the long laminate, the fluororesin layer-coated metal foil or the fluororesin layer-coated heat-resistant resin film, a test specimen of 10 cm×10 cm is cut out. In a case where the test specimen has a metal layer, the metal layer is removed by etching. The test specimen is dried at 120° C. for 1 hour in a circulating hot air oven to remove water, and the mass of the test specimen after drying is measured. Further, in the circulating hot air oven, it is heated at 250° C. for 2 hours, and the mass of the test specimen after heating is measured. From the following formula, the proportion of the dispersing agent is obtained.

Proportion of the dispersing agent={(the mass before heating at 250° C.−the mass after heating at 250° C.)/the mass before heating at 250° C.}×100

The "D50" of the resin powder is the volume-reduced cumulative 50% diameter, and is the particle diameter at a point where, when the particle size distribution is measured by a laser diffraction-scattering method, and a cumulative curve is obtained with the total volume of the population of particles being 100%, the cumulative volume becomes 50% on the cumulative curve.

The "D90" of the resin powder is the volume-reduced cumulative 90% diameter, and is the particle diameter at a point where, when the particle size distribution is measured by a laser diffraction-scattering method, and a cumulative curve is obtained with the total volume of the population of particles being 100%, the cumulative volume becomes 90% on the cumulative curve.

The dimensional ratios in FIGS. 1 to 6 are, for convenience of explanation, ones which are different from the actual ones.

<Long Laminate>

The long laminate of the present invention comprises at least one metal layer made of a long metal foil, at least one fluororesin layer in contact with the metal layer and at least one heat-resistant resin layer in contact with the fluororesin layer.

Hereinafter, the fluororesin layer and the heat-resistant resin layer may be collectively referred to also as a "resin layer".

The long laminate of the present invention may have, in a range not to impair the effects of the present invention, a layer other than the metal layer, the fluororesin layer and the heat-resistant resin layer, as the case requires. An example of such another layer may be a protective layer as described later.

The number of layers of heat-resistant resin layer is preferably one layer from the viewpoint of thinning the long laminate.

The number of layers of fluororesin layer is preferably one or two layers from the viewpoint of thinning the long laminate.

The number of layers of metal layer is preferably one or two layers from the viewpoint of thinning the long laminate.

The layer structure of the long laminate may, for example, be a metal layer/fluororesin layer/heat-resistant resin layer, or a metal layer/fluororesin layer/heat-resistant resin layer/fluororesin layer/metal layer. A "metal layer/fluororesin layer/heat-resistant resin layer" represents that a metal layer, a fluororesin layer and a heat-resistant resin layer are laminated in this order, and the same applies to other layer structures.

FIG. 1 is a cross-sectional view showing an example of a long laminate of the present invention.

The long laminate 10 comprises a metal layer 12, a fluororesin layer 14 in contact with the metal layer 12, and a heat-resistant resin layer 16 in contact with the fluororesin layer 14.

Figure 2:
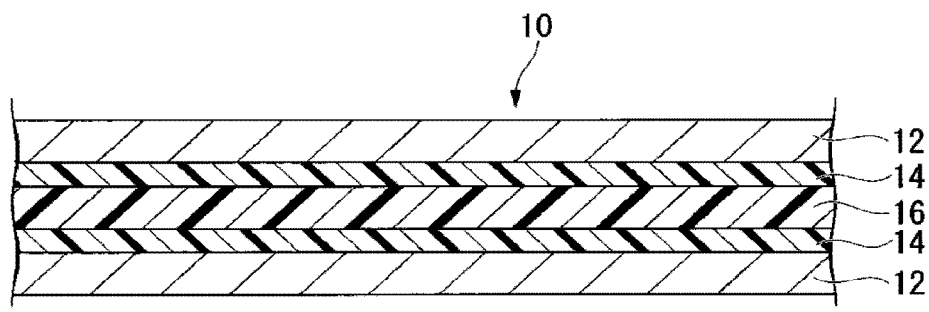
FIG. 2 is a cross-sectional view showing another example of a long laminate of the present invention.

FIG. 2 is a cross-sectional view showing another example of a long laminate of the present invention.

The long laminate 10 comprises two metal layers 12, two fluororesin layers 14 in contact with the respective metal layers 12, and a heat-resistant resin layer 16 sandwiched between the two fluororesin layers 14.

The adhesive strength at the interface between the fluororesin layer and the heat-resistant resin layer in the long laminate is preferably at least 5 N/cm, more preferably at least 7 N/cm, further preferably at least 10 N/cm, particularly preferably at least 12 N/cm. When the adhesive strength is at least the lower limit value in the above range, it is possible to suppress peeling between layers even if an impact is exerted at the time of producing a printed wiring board. The higher the adhesive strength, the better, and the upper limit is not limited.

The dimensional change rate of the long laminate is preferably at most ±0.1%, more preferably at most ±0.03%. When the dimensional change rate is within the above range, it is possible to suppress breakage of the conductor circuit at the time of producing a printed wiring board.

The folding endurance of the long laminate is preferably at least 50,000 times, more preferably at least 70,000 times. When the folding endurance is at least the lower limit value in the above range, the long laminate can be suitably used as a printed wiring board for an electronic device having a driving unit.

(Metal Layer)

The metal layer is a layer made of a metal foil.

The metal foil may be suitably selected depending on the application of the long laminate. In a case where the long laminate is to be used for a printed wiring board, the material for the metal foil may be copper, a copper alloy, stainless steel, nickel, a nickel alloy (including 42 alloy), aluminum, an aluminum alloy, etc. In a case where the long laminate is to be used for a printed wiring board, the metal foil is preferably a copper foil such as a rolled copper foil or an electrolytic copper foil.

On the surface of the metal foil, an anticorrosive layer (such as an oxide film of e.g. a chromate), a heat-resistant layer or the like may be formed. On the surface of the metal foil, surface treatment (coupling agent treatment, etc.) may be applied in order to increase the adhesive strength with the fluororesin layer.

$Rz_{JIS}$ of the surface of the metal foil is preferably low within a range where the adhesive strength with the fluororesin layer can be maintained. $Rz_{JIS}$ of the surface of the metal foil is preferably from 0.1 to 2.0 μm. When $Rz_{JIS}$ is at least the lower limit value in the above range, the adhesive strength with the fluororesin layer will be excellent. When $Rz_{JIS}$ is at most the upper limit value in the above range, the electrical properties will be excellent.

The thickness of the metal layer may be suitably selected depending on the application of the long laminate. In a case where the long laminate is to be used for a printed wiring board, the thickness of the metal layer is preferably from 5 to 75 μm.

(Resin Layer)

The resin layer is composed of the fluororesin layer and the heat-resistant resin layer. In a case where the fluororesin layer is multilayer, or the heat-resistant resin layer is multilayer, the resin layer is meant to include all layers.

The relative permittivity of the resin layer is preferably at most 3.2, more preferably at most 2.7. When the relative permittivity is at most the upper limit value in the above range, it is possible to further speed up the signal transmission of a printed wiring board. The lower limit value for the relative permittivity of the resin layer is usually 2.0.

The thickness of the resin layer (the total thickness of the thickness of the fluororesin layer and the thickness of the heat-resistant resin layer) is at most 50 μm, preferably from 7 to 50 μm, more preferably from 12 to 25 μm. When the thickness of the resin layer is at least the lower limit value in the above range, the dimensional stability of the printed wiring board will be excellent. When the thickness of the resin layer is at most the upper limit value in the above range, the folding endurance of the printed wiring board will be excellent.

The ratio of the total thickness of the fluororesin layer to the total thickness of the heat-resistant resin layer is from 0.3 to 3.0, preferably from 0.5 to 2.0, more preferably from 0.8 to 1.6. When the above ratio is at least the lower limit value in the above range, the relative permittivity of the resin layer tends to be low, and it is possible to speed up the signal transmission of a printed wiring board. When the above ratio is at most the upper limit value in the above range, the dimensional stability of the printed wiring board will be excellent.

(Fluororesin Layer)

The fluororesin layer is a layer containing a fluororesin.

The fluororesin layer is preferably a layer containing a fluororesin as the main component. In such a case, it is possible to further lower the relative permittivity and dissipation factor of the resin layer. The above layer is meant that the proportion of fluororesin in the layer is at least 80 mass %. The proportion of the fluororesin is preferably at least 85 mass %, more preferably at least 90 mass %, particularly preferably 100 mass %, in the fluororesin layer.

The fluororesin layer may contain components other than the fluororesin, as the case requires. The components other than the fluororesin may be a resin other than the fluororesin, an inorganic filler, a dispersing agent, etc.

The fluororesin layer is formed, for example, by using a liquid composition in the method for producing a long laminate of the present invention as described later.

The dispersing agent contained in the fluororesin layer is derived from a dispersing agent contained in the liquid composition. In the case of producing a long laminate, the dispersing agent is preferably contained in a suitable amount in the liquid composition or the fluororesin layer, but in the fluororesin layer of the finally obtained long laminate, preferably it should not be contained as much as possible. If a dispersing agent is contained in a large amount in the fluororesin layer, the relative permittivity of the resin layer becomes high due to the water absorption of the dispersing agent. The proportion of the dispersing agent to be contained in the fluororesin layer of the finally obtained long laminate is preferably less than 2.0 mass %, more preferably less than 1.0 mass %, to the fluororesin layer. The lower limit value for the proportion of the dispersing agent to be contained in the fluororesin layer of the finally obtained long laminate is 0 mass %.

The proportion of the dispersing agent to be contained in the fluororesin layer of the finally obtained long laminate, may be adjusted by e.g. the heating temperature at the time of lamination in the method for producing a long laminate of the present invention as will be described later, the temperature during the heat treatment after lamination, etc.

The thickness per one fluororesin layer is from 1 to 10 μm, preferably from 2 to 9 μm, more preferably from 3 to 8 μm. When the thickness per one fluororesin layer is at least the lower limit value in the above range, it is possible to speed up the signal transmission of a printed wiring board. When the thickness per one fluororesin layer is at most the upper limit value in the above range, thinning of the resin layer of the printed wiring board becomes possible.

The melting point of the fluororesin is preferably at least 270° C., more preferably from 270 to 380° C., further preferably from 270 to 320° C., still further preferably from 280 to 320° C., particularly preferably from 295 to 315° C., most preferably from 295 to 310° C. When the melting point of the fluororesin is at least the lower limit value in the above range, the heat resistance of the fluororesin layer will be excellent. When the melting point of the fluororesin is at most the upper limit value in the above range, the melt moldability of the fluororesin will be excellent.

The melting point of the fluororesin may be adjusted by e.g. the types or proportions of the units constituting the fluororesin, the molecular weight of the fluororesin, etc. For example, as the proportion of tetrafluoroethylene (TFE) units increases, the melting point tends to rise.

MFR of the fluororesin at a temperature higher by at least 20° C. than the melting point of the fluororesin is preferably from 0.1 to 1,000 g/10 min, more preferably from 0.5 to 100 g/10 min, further preferably from 1 to 30 g/10 min, particularly preferably from 5 to 20 g/10 min. When MFR is at least the lower limit value in the above range, the melt moldability of the fluororesin will be excellent. When MFR is at most the upper limit value in the above range, the mechanical strength of the fluororesin layer will be excellent.

MFR is an index for the molecular weight of the fluororesin, i.e. the larger the MFR, the smaller the molecular weight, and the smaller the MFR, the larger the molecular weight. MFR of the fluororesin may be adjusted by the production conditions of the fluororesin. For example, if the polymerization time is shortened at the time of polymerization of a monomer, MFR tends to increase.

The specific permittivity of the fluororesin is preferably at most 2.5, more preferably at most 2.4, particularly preferably from 2.0 to 2.4. As the specific permittivity of the fluororesin is low, it is possible to further speed up the signal transmission of a printed wiring board. The lower limit value for the relative permittivity is usually 2.0.

The relative permittivity of the fluororesin may be adjusted by the proportion of TFE units.

As the fluororesin, from such a viewpoint that formation of a fluororesin layer will be easy, preferred is a melt-moldable fluororesin, and more preferred is the later-described adhesive fluororesin. When the fluororesin is an adhesive fluororesin, adhesion between the fluororesin layer and the heat-resistant resin layer, and adhesion between the fluororesin layer and the metal layer, will be excellent.

The melt-moldable fluororesin may be a tetrafluoroethylene-perfluoro(alkyl vinyl ether) copolymer, a tetrafluoroethylene-hexafluoropropylene copolymer, an ethylene-tetrafluoroethylene copolymer, polyvinylidene fluoride, polychlorotrifluoroethylene, an ethylene-chlorotrifluoroethylene copolymer, or a modified polytetrafluoroethylene (such as a polymer having TFE and a trace amount of CH$_2$=CH(CF$_2$)$_4$F or CF$_2$=CFOCF$_3$ copolymerized). Further, a polytetrafluoroethylene may also be mentioned as one showing melt flowability.

In a case where instead of the melt-moldable fluororesin, a non-melt-moldable fluororesin, e.g. a polytetrafluoroethylene exhibiting no melt flowability, is employed, at the time of subjecting the resin material to mechanical grinding treatment in the process for producing a resin powder as will be described later, the polytetrafluoroethylene tends to be fibrillated, whereby it will be difficult to obtain a resin powder.

The adhesive fluororesin in the present invention is a melt-moldable fluororesin having at least one type of functional group (hereinafter referred to also as an "adhesive group") selected from the group consisting of a carbonyl group-containing group, a hydroxy group, an epoxy group, an amide group, an amino group and an isocyanate group.

As the adhesive group which the adhesive fluororesin has, two or more types may be used in combination.

As the adhesive group, from the viewpoint of excellent adhesion between the fluororesin layer and the heat-resistant resin layer, and between the fluororesin layer and the metal layer, preferred is a carbonyl group-containing group.

The carbonyl group-containing group may be a carbonate group (—OC(O)O—), a carboxy group, a haloformyl group, an alkoxycarbonyl group, an acid anhydride group (—C(O)OC(O)—), etc.

The haloformyl group may be —C(O)F, or —C(O)Cl.

The alkoxycarbonyl group may be —C(O)OCH$_3$, or —C(O)OCH$_2$CH$_3$. The content of adhesive groups in the adhesive fluororesin is preferably from 10 to 60,000, more preferably from 100 to 50,000, further preferably from 100 to 10,000, particularly preferably from 300 to 5,000, in number, to the number of carbon atoms of 1×10$^6$ in the main chain of the adhesive fluororesin. When the content of adhesive groups is at least the lower limit value in the above range, the adhesion between the fluororesin layer and the heat-resistant resin layer and between the fluororesin layer and the metal layer will be further excellent. When the content of adhesive groups is at most the upper limit value in the above range, the heat resistance, color, etc. of the adhesive fluororesin will be good.

The content of adhesive groups can be measured by methods such as nuclear magnetic resonance (NMR) analysis, infrared absorption spectrum analysis, etc. For example, by using a method such as an infrared absorption spectrum analysis as described in JP-A-2007-314720, it is possible to measure the proportion (mol %) of units having an adhesive group in all units constituting the adhesive fluororesin.

As the adhesive fluororesin, a fluorinated polymer having at least one of a unit having an adhesive group and a terminal group having an adhesive group, may be mentioned. Further, a fluorinated polymer obtained by introducing an adhesive group by plasma treatment or radiation treatment, etc., or a fluorinated polymer which has been made melt-moldable by introduction of an adhesive group, may also be mentioned.

Specifically, for example, a polymer (a type of modified PTFE) obtained by copolymerising TFE and a trace amount of an adhesive group-containing monomer, a polymer (a type of modified PTFE) obtained by copolymerising TFE, a trace amount of CH$_2$=CH(CF$_2$)$_4$F or CF$_2$=CFOCF$_3$ and a trace amount of an adhesive group-containing monomer, a modified PTFE obtained by introducing an adhesive group by plasma treatment or radiation treatment, PTFE obtained by introducing an adhesive group by plasma treatment or radiation treatment, etc., may be mentioned.

As the adhesive fluororesin, from such a viewpoint that adhesion between the fluororesin layer and the heat-resistant resin layer and between the fluororesin layer and the metal layer will be further excellent, and also from such a viewpoint that the electrical properties of the fluororesin layer will be further excellent, preferred is a fluorinated polymer (hereinafter referred to also as fluoropolymer A) comprising units (u1) derived from TFE or chlorotrifluoroethylene (CTFE), units (u2) derived from a cyclic hydrocarbon monomer having an acid anhydride group (hereinafter referred to also as an "acid anhydride monomer") and units (u3) derived from a fluorinated monomer (but excluding TFE and CTFE).

As the monomer constituting units (u1), from such a viewpoint that the heat resistance of the fluororesin layer will be excellent, TFE is preferred.

As the acid anhydride monomer, itaconic anhydride (hereinafter referred to also as "IAH"), citraconic anhydride (hereinafter referred to also as "CAH"), 5-norbornene-2,3-dicarboxylic anhydride (hereinafter referred to also as "NAH"), maleic anhydride, etc. may be mentioned. As the acid anhydride monomer, two or more types may be used in combination.

As the acid anhydride monomer, from such a viewpoint that adhesion between the fluororesin layer and the heat-resistant resin layer and between the fluororesin layer and the metal layer, will be further excellent, IAH and NAH are preferred, and NAH is particularly preferred.

In the fluorinated polymer A, there may be a case where some of acid anhydride groups in units (u2) are hydrolyzed, and, as a result, units of dicarboxylic acids (such as itaconic acid, citraconic acid, 5-norbornene-2,3-dicarboxylic acid, maleic acid, etc.) corresponding to the acid anhydride monomer will be contained, and such dicarboxylic acid units shall be included in units (u2).

The fluorinated monomer constituting units (u3) may be a fluoroolefin such as vinyl fluoride, vinylidene fluoride, trifluoroethylene, hexafluoropropylene (HFP) or hexafluoroisobutylene, a perfluoro(alkyl vinyl ether) (hereinafter referred to also as "PAVE"), a fluorovinyl ether having a functional group, a fluoro(divinyl ether), a polyfluoro(alkyl ethylene) (hereinafter referred to also as "FAE"), or a fluoromonomer having a ring structure.

PAVE may, for example, be CF$_2$=CFOCF$_3$, CF$_2$=CFOCF$_2$CF$_3$, CF$_2$=CFOCF$_2$CF$_2$CF$_3$(PPVE), CF$_2$=CFOCF$_2$CF$_2$CF$_2$CF$_3$ and CF$_2$=CFO(CF$_2$)$_6$F, and PPVE is preferred.

FAE may, for example, be CH$_2$=CF(CF$_2$)$_2$F, CH$_2$=CF(CF$_2$)$_3$F, CH$_2$=CF(CF$_2$)$_4$F, CH$_2$=CF(CF$_2$)$_5$F, CH$_2$=CF(CF$_2$)$_6$F, CH$_2$=CF(CF$_2$)$_2$H, CH$_2$=CF(CF$_2$)$_3$H, CH$_2$=CF(CF$_2$)$_4$H, CH$_2$=CF(CF$_2$)$_5$H, CH$_2$=CF(CF$_2$)$_6$H, CH$_2$=CH(CF$_2$)$_2$F(PFEE), CH$_2$=CH(CF$_2$)$_3$F, CH$_2$=CH(CF$_2$)$_4$F (PFBE), CH$_2$=CH(CF$_2$)$_5$F, CH$_2$=CH(CF$_2$)$_6$F, CH$_2$=CH(CF$_2$)$_2$H, CH$_2$=CH(CF$_2$)$_3$H, CH$_2$=CH(CF$_2$)$_4$H, CH$_2$=CH(CF$_2$)$_5$H and CH$_2$=CH(CF$_2$)$_6$H, and PFBE and PFEE are preferred.

The fluoromonomer having a ring structure may, for example, be perfluoro(2,2-dimethyl-1,3-dioxole), 2,2,4-trifluoro-5-trifluoromethoxy-1,3-dioxole, and perfluoro(2-methylene-4-methyl-1,3-dioxolane).

The fluorovinyl ether having a functional group may, for example, be CF$_2$=CFOCF$_2$CF(CF$_3$)OCF$_2$CF$_2$SO$_2$F, CF$_2$=CFOCF$_2$CF$_2$SO$_2$F, CF$_2$=CFOCF$_2$CF(CF$_3$)OCF$_2$CF$_2$SO$_3$H, CF$_2$=CFOCF$_2$CF$_2$SO$_3$H, CF$_2$=CFO(CF$_2$)$_3$COOCH$_3$, and CF$_2$=CFO(CF$_2$)$_3$COOH.

The fluoro(divinyl ether) may be CF$_2$=CFCF$_2$CF$_2$OCF=CF$_2$, and CF$_2$=CFCF$_2$OCF=CF$_2$.

As the fluorinated monomer constituting units (u3), from such a viewpoint that moldability of the fluorinated polymer A and folding endurance, etc. of the fluororesin layer will be excellent, at least one member selected from the group consisting of HFP, PAVE and FAE is preferred, and PAVE is particularly preferred.

Preferred proportions of the respective units to the total amount of units (u1), units (u2) and units (u3) in the fluorinated polymer A are as follows.

The proportion of units (u1) is preferably from 90 to 99.89 mol %, more preferably from 96 to 98.95 mol %.

The proportion of units (u2) is preferably from 0.01 to 3 mol %, more preferably from 0.05 to 1 mol %.

The proportion of units (u3) is preferably from 0.1 to 9.99 mol %, more preferably from 1 to 9.95 mol %.

The fluorinated polymer A may further have units derived from other monomers.

Other monomers may be olefins (ethylene, propylene, 1-butene, etc.), vinyl esters (vinyl acetate, etc.), etc., and from the viewpoint of excellent mechanical strength, etc. of the fluororesin layer, ethylene, propylene and 1-butene are preferred, and ethylene is particularly preferred.

Specific examples of the fluorinated polymer A may be a copolymer comprising TFE units, NAH units and PPVE units, a copolymer comprising TFE units, IAH units and PPVE units, a copolymer comprising TFE units, CAH units and PPVE units, a copolymer comprising TFE units, IAH units and HFP units, a copolymer comprising TFE units, CAH units and HFP units, a copolymer comprising TFE units, IAH units, PFBE units and ethylene units, a copolymer comprising TFE units, CAH units, PFBE units and ethylene units, a copolymer comprising TFE units, IAH units, PFEE units and ethylene units, a copolymer comprising TFE units, CAH units, PFEE units and ethylene units, and a copolymer comprising TFE units, IAH units, HFP units, PFBE units and ethylene units.

As the fluorinated polymer A, a copolymer comprising TFE units, NAH units and PPVE units, a copolymer comprising TFE units, IAH units and PPVE units, and a copolymer comprising TFE units, CAH units and PPVE units, are preferred.

(Heat-Resistant Resin Layer)

The heat-resistant resin layer is a layer containing a heat resistant resin (excluding a fluororesin).

As the heat-resistant resin layer, a layer composed mainly of a heat-resistant resin is preferred. In such a case, the dimensional stability of the long laminate will be further excellent. The above layer means that the proportion of the heat-resistant resin in the layer is at least 80 mass %. The proportion of the heat-resistant resin is preferably at least 85 mass %, more preferably at least 90 mass %, particularly preferably 100 mass %, in the heat-resistant resin layer.

The heat-resistant resin may be a polyimide (an aromatic polyimide, etc.), a polyarylate, a polysulfone, a polyallyl sulfone (polyether sulfone, etc.), an aromatic polyamide, an aromatic polyether amide, a polyphenylene sulfide, a polyallyl ether ketone, a polyamideimide, a liquid crystal polyester, a liquid crystal polyester amide, etc.

The heat-resistant resin layer may contain components other than the heat-resistant resin as the case requires. As other components, resins other than the heat-resistant resin, inorganic fillers, various additives, etc. may be mentioned.

The heat-resistant resin layer is derived, for example, from a heat-resistant resin film used in the method for producing a long laminate of the present invention. The heat-resistant resin film may be a single layer or may be multilayer.

As the heat-resistant resin film, for example, in the case of the aromatic polyimide film, various commercially available products may be used. As a film of single-layer structure, Kapton (registered trademark) EN manufactured by Du Pont-Toray Co., Ltd. may be mentioned. As a film of multilayer structure, UPILEX (registered trademark) NVT manufactured by Ube Industries, Ltd. having a thermoplastic polyimide layer formed on both sides of an aromatic polyimide film, or Pixeo (registered trademark) BP manufactured by KANEKA CORPORATION may be mentioned.

Further, in the case of a liquid crystal polyester film, as a commercially available product, VECSTAR (registered trademark) CT-Z manufactured by Kuraray Co., Ltd. may be mentioned.

The heat-resistant resin film may be surface-treated. As the surface treatment, discharge treatment such as atmospheric pressure plasma discharge treatment, vacuum plasma discharge treatment, or corona discharge treatment, primer treatment of applying a silane coupling agent, etc. may be mentioned.

Particularly, it is more preferred to conduct atmospheric pressure plasma discharge treatment or vacuum plasma discharge treatment, from the viewpoint of improving the adhesive strength.

In the case of a polyimide film, the lower the water absorption of the film, the less the deterioration in the dielectric properties at the time of moisture absorption, and the less the foaming at the time of lamination at high temperatures, such being preferred. As such a polyimide, a copolymer of paraphenyldiamine and 3,3',4,4'-biphenyltetracarboxylic dianhydride is preferred. Further, an aromatic polyimide film having no thermoplastic polyimide layer is preferred.

The water absorption of the heat-resistant resin layer is preferably at most 2.0%, more preferably at most 1.5%, further preferably at most 1.3%. The water absorption is a weight change rate after immersion in water at 23° C. for 24 hours, as defined in ASTM D570.

(Protective Layer)

In a case where the outermost surface layer is a fluororesin layer, from the viewpoint of suppressing the thickness unevenness of the fluororesin layer, the long laminate of the present invention may further have a protective layer in contact with the fluororesin layer to be the outermost layer, and in a case where the outermost layer is a metal layer, from the viewpoint of suppressing oxidation of the metal foil by heat, it may further have a protective layer in contact with the metal layer to be the outermost layer. Here, the long laminate of the present invention may have protective layers on both outermost surface layers or may have a protective layer on only one of the outermost surface layers. In either case, at the time of using the long laminate, for example, at the time of using it as a printed wiring board, the protective layer is preferably a layer which can be easily peeled off. As such a protective layer, a commercially available protective film may be suitably selected and used.

As the material for the protective layer, from the viewpoint of heat resistance against the laminate roll which becomes to be a temperature above the melting point of the fluororesin, a polyimide and a polyether ether ketone are preferred, and the shape is preferably a film.

The material for the protective layer may be a polyimide film (such as Apical NPI (manufactured by KANEKA CORPORATION), or UPILEX S (manufactured by Ube Industries, Ltd.)).

Further, the material for the protective layer is preferably a material which has a tensile modulus of at least 50 MPa under laminating conditions in the method for producing a long laminate as described later. In this case, cracking is unlikely to occur at the lamination temperature or the lamination pressure.

Further, the material for the protective layer is a material which has a coefficient of linear expansion of at most 100 ppm/° C. under the above laminating conditions. In this case, the dimensional change rate of the protective layer due to heating and cooling cycles in the laminate, will be suppressed, and wrinkles will be less likely to be formed on the surface of the long laminate.

The thickness of the protective layer is preferably from 50 to 150 μm, particularly preferably from 75 to 125 μm. In such a case, in the method for producing a long laminate as described later, the linear pressure unevenness by the metal rolls will be suppressed, whereby it will be easy to suppress the thickness unevenness of the fluororesin layer. Further, heat transfer from the metal rolls will be unimpeded, whereby it will be easy to sufficiently heat the respective substrates.

(Advantageous Effects)

In the long laminate of the present invention as described above, the thickness per one fluororesin layer is at most 10 μm, and the ratio of the total thickness of the fluororesin layer to the total thickness of the resin layer is from 0.3 to 3.0, whereby the resin layer can be made thin.

Further, in the long laminate of the present invention, the thickness per one fluororesin layer is at least 1 μm, and the above ratio is at least 0.3, whereby it is possible to speed up signal transmission of a printed wiring board. Further, in the long laminate of the present invention, the above ratio is at most 3.0, whereby dimensional stability of the printed wiring board will be excellent.

Further, in the long laminate of the present invention, the total thickness of the thickness of the fluororesin layer and the thickness of the heat-resistant resin layer is at most 50 μm, whereby folding endurance of the printed wiring board will be excellent.

<Liquid Composition>

The liquid composition to be used in the method for producing a long laminate of the present invention comprises a liquid medium, a resin powder dispersed in the liquid medium, and a dispersing agent.

The liquid composition may further contain a resin soluble in the liquid medium (hereinafter referred to also as a "soluble resin"), as the case requires.

The resin composition of the present invention may further contain components other than the liquid medium, the resin powder, the dispersing agent and the soluble resin (hereinafter referred to also as "other components"), as the case requires.

(Liquid Medium)

The liquid medium as a dispersion medium is an inert component which is liquid at 25° C.

The liquid medium is preferably a medium which has a lower boiling point than the components other than the liquid medium contained in the liquid composition, and which can be volatilized and removed by heating, etc.

The liquid medium may be water, an alcohol (methanol, ethanol, etc.), a nitrogen-containing compound (N,N-dimethylformamide, N,N-dimethylacetamide, N-methyl-2-pyrrolidone, etc.), a sulfur-containing compound (dimethyl sulfoxide, etc.), an ether (diethyl ether, dioxane, etc.), an ester (ethyl lactate, ethyl acetate, etc.), a ketone (methyl ethyl ketone, methyl isopropyl ketone, etc.), a glycol ether (ethylene glycol monoisopropyl ether, etc.), cellosolve (methyl cellosolve, ethyl cellosolve, etc.), etc. As the liquid medium, two or more types may be used in combination. As the liquid medium, preferred is one which does not react with the resin powder.

(Resin Powder)

The resin powder is an aggregate of resin particles composed of a fluororesin as the main component. When the fluororesin is the main component, it is possible to further lower the specific permittivity and the dissipation factor of the resin layer. Further, a resin powder having a high bulk density can be easily obtained. The larger the bulk density of the resin powder, the better the handling efficiency. The resin powder composed of a fluororesin as the main component means that the proportion of the fluororesin in the resin particles constituting the resin powder is at least 80 mass %. The proportion of the fluororesin is preferably at least 85 mass %, more preferably at least 90 mass %, particularly preferably 100 mass %.

The resin particles constituting the resin powder may further contain components other than the fluororesin, as the case requires. The components other than the fluororesin may be an aromatic polyester, a polyamide-imide, a thermoplastic polyimide, a polyphenylene ether, a polyphenylene oxide, an inorganic filler, a rubber, etc.

D50 of the resin powder is preferably from 0.05 to 6.0 μm, more preferably from 0.2 to 3.5 μm. When D50 of the resin powder is at least the lower limit value in the above range, flowability of the resin powder will be sufficient, and handling will be easy. When D50 of the resin powder is at most the upper limit value in the above range, dispersibility in the liquid medium of the resin powder will be excellent. Further, the filling rate of the resin powder to the fluororesin layer can be made high, whereby it is possible to further lower the specific permittivity and the dissipation factor of the resin layer. Further, the thickness of the fluororesin layer can be made thin.

D90 of the resin powder is preferably at most 8.0 μm, particularly preferably from 1.5 to 5.0 μm. When D90 is at most the upper limit value in the above range, dispersibility of the resin powder in the liquid medium will be excellent. D90 of the resin powder is preferably made to be close to D50, from such a viewpoint that uniformity of the fluororesin layer will be thereby excellent.

The loose packing bulk density of the resin powder is preferably at least 0.05 g/mL, more preferably from 0.08 to 0.5 g/mL.

The densely packing bulk density of the resin powder is preferably at least 0.05 g/mL, more preferably from 0.1 to 0.8 g/mL.

In such a case, it will be easy to balance the handling efficiency and the packing rate of the resin powder.

(Dispersing Agent)

The dispersing agent may, for example, be a surfactant.

The surfactant may be a nonionic surfactant, an anionic surfactant, a cationic surfactant, etc. As the surfactant, a nonionic surfactant is preferred. As the surfactant, two or more types may be used in combination.

The surfactant is preferably a fluorinated surfactant having a fluorinated group and a hydrophilic group. When the fluorinated surfactant is used, it will be easy to lower the surface tension of the liquid medium, thereby to improve the wettability to the surface of the resin powder and to improve the dispersibility of the resin powder.

Further, fluorinated groups will be adsorbed on the surface of the resin powder composed of a fluororesin as the main component, and hydrophilic groups will be extended in the liquid medium, whereby coagulation of the resin powder will be prevented by steric hindrance of the hydrophilic groups, and it becomes easy to further improve the dispersion stability.

As the fluorinated surfactant, the following surfactants may be mentioned.

Ftergent M series, Ftergent F series, Ftergent G series, Ftergent P-D series, Ftergent 710FL, Ftergent 710FM, Ftergent 710FS, Ftergent 730FL, Ftergent 730LM, Ftergent 610FM, Ftergent 601AD, Ftergent 601ADH2, Ftergent 602A, Ftergent 650AC, Ftergent 681, manufactured by NEOS COMPANY LIMITED.

Surfron series (Sarfron S-386, etc.), manufactured by AGC Seimi Chemical Co., Ltd.

MEGAFACE series (MEGAFACE F-553, MEGAFACE F-555, MEGAFACE F-556, MEGAFACE F-557, MEGAFACE F-559, MEGAFACE F-562, MEGAFACE F-565, etc.), manufactured by DIC Corporation.

UNIDYNE series (UNIDYNE DS-403N, etc.), manufactured by DAIKIN INDUSTRIES, LTD.

(Soluble Resin)

The soluble resin which the liquid composition may contain, may be a non-curable resin or may be a thermosetting resin.

The non-curable resin may be a heat-meltable resin or a non-meltable resin. As the heat-meltable resin, a thermoplastic polyimide, etc. may be mentioned.

The thermosetting resin may be an epoxy resin, an acrylic resin, a phenolic resin, a polyester resin, a polyolefin resin, a modified polyphenylene ether resin, a polyfunctional cyanic acid ester resin, a polyfunctional maleimide-cyanic acid ester resin, a polyfunctional maleimide resin, a vinyl ester resin, an urea resin, a diallyl phthalate resin, a melamine resin, a guanamine resin, a melamine-urea co-condensation resin, a fluororesin having reactive groups (but, excluding the fluorinated polymer A), a thermosetting polyimide, a polyamic acid as its precursor, a liquid crystal polyester amide, etc.

As the thermosetting resin, from the viewpoint of being useful for a printed wiring board, an epoxy resin, an acrylic resin, a bismaleimide resin, a modified polyphenylene ether resin, a thermosetting polyimide, a polyamic acid as its precursor, and a liquid crystal polyester amide, are preferred, and an epoxy resin, a modified polyphenylene ether resin, a thermosetting polyimide, a polyamic acid as its precursor, and a liquid crystal polyester amide are more preferred. As the thermosetting resin, two or more types may be used in combination.

(Other Components)

Other components which the liquid composition may contain, may be a defoaming agent, an inorganic filler, a reactive alkoxysilane, a dehydrating agent, a plasticizer, a weathering agent, an antioxidant, a thermal stabilizer, a lubricant, an antistatic agent, a brightener, a colorant, a conductive agent, a release agent, a surface treatment agent, a viscosity modifier, a flame retardant, etc.

The content of the liquid medium in the liquid composition is preferably from 1 to 1,000 parts by mass, more preferably from 30 to 250 parts by mass, to 100 parts by mass of the resin powder. When the content of the liquid medium is within the above range, coating properties become to be good.

The content of the dispersing agent in the liquid composition is preferably from 0.1 to 20 parts by mass, more preferably from 0.3 to 7 parts by mass, to 100 parts by mass of the resin powder. When the content of the dispersing agent is within the above range, it will be easy to suppress the amount of the dispersing agent remaining in the fluororesin layer, while maintaining the dispersibility of the resin powder.

<Method for Producing Long Laminate>

The method for producing a long laminate of the present invention is a method of producing a long laminate having at least one metal layer made of a long metal foil, at least one fluororesin layer in contact with the metal layer, and at least one heat-resistant resin layer in contact with the fluororesin layer, by a production method comprising the following step A and the following step B.

Step A:

A step in which, while conveying a long metal foil or a long heat-resistant resin film, the above-described liquid composition is applied on the metal foil or the heat-resistant resin film to form a wet film, and while conveying the long wet film-coated metal foil or heat-resistant resin film, the wet film is heated to remove the liquid medium and melt the resin powder, to form a fluororesin layer, thereby to obtain a fluororesin layer-coated metal foil or a fluororesin layer-coated heat-resistant resin film.

Step B:

In the case where the fluororesin layer-coated metal foil is produced, a step of laminating the fluororesin layer-coated metal foil and a substrate containing a long heat-resistant resin film so that the fluororesin layer and the heat-resistant resin film are in contact; or in the case where the fluororesin layer-coated heat-resistant resin film is produced, a step of laminating the fluororesin layer-coated heat-resistant resin film and a substrate containing a long metal foil so that the fluororesin layer of the fluororesin layer-coated heat-resistant resin film and the metal foil are in contact.

In the case where the fluororesin layer-coated heat-resistant resin film is to be obtained in the step A, a heat-resistant resin film having both surfaces coated with fluororesin layers, may be obtained. A specific method may be a method in which, after obtaining the fluororesin layer-coated heat-resistant resin film, another fluororesin layer is further formed on the surface of the heat-resistant resin film on the side opposite to the fluororesin layer, or a method in which, on both surfaces of a heat-resistant resin film, fluororesin layers are formed simultaneously or sequentially.

The lamination in step B is preferably carried out by passing between a pair of metal rolls or a pair of endless belts.

That is, in the case where a long fluororesin layer-coated metal foil is produced in step A, it is preferred to laminate the long fluororesin layer-coated metal foil and a substrate containing a long heat-resistant resin film, by passing them between a pair of metal rolls or a pair of endless belts, so that the fluororesin layer and the heat-resistant resin film are in contact.

In the case where a long fluororesin layer-coated heat-resistant resin film is produced in step A, it is preferred to laminate the long fluororesin layer-coated heat-resistant resin film and a substrate containing a long metal foil by passing them between a pair of metal rolls or a pair of endless belts, so that the fluororesin layer and the metal foil are in contact.

Further, the method for producing a long laminate of the present invention may have a step of applying surface treatment to the fluororesin layer-coated metal foil or the fluororesin layer-coated heat-resistant resin film.

In order to form a fluororesin layer from the wet film being a coating film of the liquid composition, the wet film is heated to evaporate and remove the liquid medium in the wet film to form a film of the resin powder, and then, the resin powder is melted to convert the film of the resin powder to a fluororesin layer. Hereinafter, the evaporation and removal of the liquid medium by heating will be referred to also as drying, and the film of the resin powder formed by evaporating and removing the liquid medium from the wet film will be referred to also as a dried film. Further, melting of the resin powder by heating will be referred to also as firing.

The drying temperature is preferably a temperature of at least the boiling point of the liquid medium, and the firing temperature is a temperature of at least the melting point of the fluororesin. The drying temperature and the firing temperature may be the same temperature, but in order to make the homogeneity of the surface or inside of the fluororesin layer to be good, the drying temperature is preferably lower than the melting point of the fluororesin.

(Application, Drying and Firing)

Figure 3:
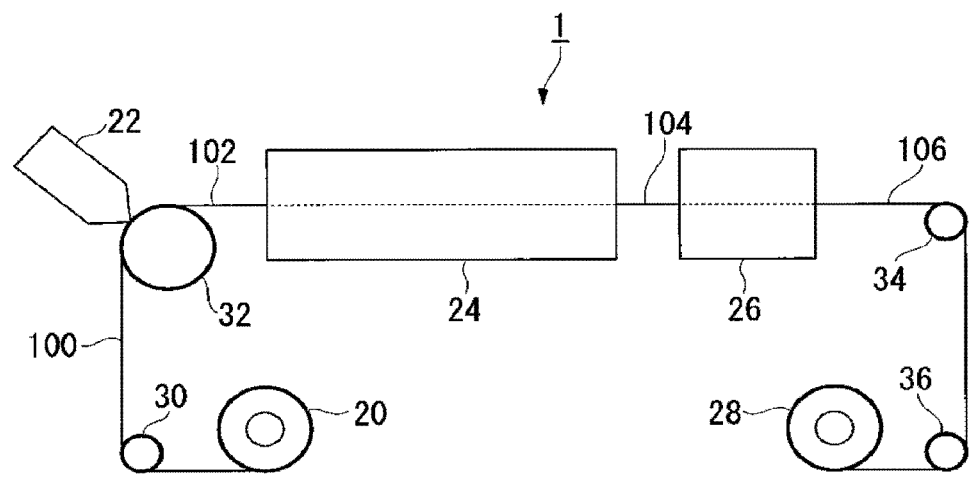
FIG. 3 is a schematic block diagram showing an example of an apparatus for conducting application of a liquid composition and heating of a wet film.

FIG. 3 is a schematic diagram showing an example of an apparatus for conducting application of the liquid composition and heating of the wet film.

The apparatus 1 comprises a unwinding roll 20 on which a long metal foil or heat-resistant resin film 100 is wound, a die coater 22 which applies the liquid composition to the surface of the metal foil or heat-resistant resin film 100, a drying device 24 which dries a wet film of the wet film-coated metal foil or heat-resistant resin film 102, a firing device 26 which fires a dried film of the dried film-coated metal foil or heat-resistant resin film 104, a winding roll 28 which winds up the fluororesin layer-coated metal foil or heat-resistant resin film 106, a guide roll 30 which directs the metal foil or heat-resistant resin film 100 unwound from the unwinding roll 20 towards the die coater 22, a die back roll 32 which is disposed to face the die coater 22 to interpose the metal foil or heat-resistant resin film 100 and which directs the wet film-coated metal foil or heat-resistant resin film 102 towards the drying device 24, and a guide roll 34 and guide roll 36 which direct the fluororesin layer-coated metal foil or heat-resistant resin film 106 passed through the firing device 26 towards the winding roll 28.

However, the apparatus for conducting application of the liquid composition and heating of the wet film, is not limited to the illustrated example. For example, in place of the die coater, it is possible to use another coating device. It may be divided into an apparatus provided with a coating device and a drying device, and an apparatus provided with a firing device.

The liquid composition is applied to the surface of a metal foil or heat-resistant resin film to form a wet film.

In the present invention, from the viewpoint good productivity, it is preferred that, while conveying a long metal foil or heat-resistant resin film by roll-to-roll, the liquid composition is applied to the surface of the metal foil or heat-resistant resin film.

As the method for applying the liquid composition, in addition to a die coating method, a spraying method, a roll coating method, a spin coating method, a gravure coating method, a micro gravure coating method, a gravure offset method, a knife coating method, a kiss coating method, a bar coating method, a fountain Mayer bar method, a slot die coating method, etc. may be mentioned.

The wet film of the wet film-coated metal foil or heat-resistant resin film is heated, to dry the wet film thereby to form a dried film.

In the present invention, from the viewpoint of good productivity, it is preferred to heat the wet film, while conveying the long wet film-coated metal foil or heat-resistant resin film by roll-to-roll.

In the drying, it is not necessarily required to completely remove the liquid medium, so long as the liquid medium may be removed to such an extent that the dried film can stably maintain the film shape. In the drying, it is preferred to remove at least 50 mass % out of the liquid medium contained in the liquid composition.

The drying may be carried out in one stage, or may be carried out in two or more stages at different temperatures.

The heating method of the wet film may be a method of using an oven, a method of using a forced-air drying oven, a method of irradiating heat rays such as infrared rays, etc.

The heating temperature of the wet film is preferably from 35 to 250° C., more preferably from 70 to 220° C. The heating temperature is the temperature of the atmosphere in the drying apparatus.

The heating time of the wet film is preferably from 0.1 to 30 minutes, more preferably from 0.5 to 20 minutes.

The dried film of the dried film-coated metal foil or heat-resistant resin film is heated to fire the dried film to form a fluororesin layer.

In the present invention, from the viewpoint good productivity, it is preferred to heat the dried film, while conveying the long dried film-coated metal foil or heat-resistant resin film by roll-to-roll.

By firing the dried film, individual particles of the resin powder are melted and integrated, whereby it is possible to form a uniform fluorofilm. In a case where the liquid composition contains a heat meltable soluble resin, it is possible to form a fluororesin layer made of a melt blend of the fluororesin and the soluble resin. In a case where the liquid composition contains a thermosetting soluble resin, it is possible to form a fluororesin layer made of a cured product of the fluororesin and the thermosetting resin.

The firing may be carried out in one stage, or may be carried out in two or more stages at different temperatures.

As the heating method of the dried film, a method of using an oven, a method of using a forced-air drying oven, a method of irradiating heat rays such as infrared rays, etc. may be mentioned. In order to increase the surface smoothness of the fluororesin layer, pressing may be made by means of a heating plate, a heating roll, etc. As the heating method of the dried film, a method of irradiating far-infrared rays with the effective wavelength band of from 2 to 20 μm (preferably from 3 to 7 μm) is preferred with a view to bringing about homogeneous melting of the fluororesin and being capable of forming a fluororesin layer wherein a residue of insufficiently molten resin powder is little.

The heating temperature of the dried film is preferably from 270 to 400° C., more preferably from 310 to 370° C. The heating temperature is the temperature of the atmosphere in the firing device, or the surface temperature of the heating plate, the heating roll, etc.

The heating time of the dried film is preferably from 1 to 300 minutes, more preferably from 3 to 60 minutes.

The atmosphere at the time of heating of the dried film is preferably an inert gas atmosphere with a view to suppressing the oxidation of the metal foil, the fluororesin and the heat-resistant resin.

The inert gas atmosphere is made of an inert gas having the oxygen gas concentration suppressed to be low. As the inert gas, helium gas, neon gas, argon gas, nitrogen gas, etc., may be mentioned, and nitrogen gas is preferred.

The oxygen gas concentration in the inert gas atmosphere is preferably from 100 to 500 ppm, more preferably from 200 to 300 ppm.

The dispersing agent contained in the liquid composition will be decomposed and volatilized by the high temperature in the drying and firing. The dispersing agent is preferably not contained as far as possible in the fluororesin layer of the finally obtainable long laminate, but at the time of producing a long laminate, there may be a case where a trace amount of a dispersing agent will act as a plasticizer for the fluororesin layer and thus will contribute to the improvement of adhesion between the fluororesin layer and the heat-resistant resin layer, and between the fluororesin layer and the metal layer.

The proportion of the dispersing agent contained in the fluororesin layer in the fluororesin layer-coated metal foil and the fluororesin layer-coated heat-resistant film, is preferably from 0.1 to 2.0 mass %, more preferably from 0.1 to 1.0 mass %, to the fluororesin layer. When the proportion of the dispersing agent contained in the fluororesin layer is at least the lower limit value in the above range, air bubbles to be contained between the layers of the fluororesin layer and the heat-resistant resin layer, and the fluororesin layer and the metal layer after lamination, will decrease. When the proportion of the dispersing agent contained in the fluororesin layer is at most the upper limit value in the above range, adhesion between the fluororesin layer and the heat-resistant resin layer and between the fluororesin layer and the metal layer after lamination, will be further excellent.

The proportion of the dispersing agent contained in the fluororesin layer in the fluororesin layer-coated metal foil and the fluororesin layer-coated heat-resistant film, can be adjusted by the heating temperature and heating time in the drying and in the firing.

The thickness of the fluororesin layer in the fluororesin layer-coated metal foil and the fluororesin layer-coated heat-resistant resin film is preferably from 1 to 10 μm, more preferably from 2 to 9 μm, further preferably from 3 to 8 μm. When the thickness of the fluororesin layer is at least the lower limit value in the above range, it will be easy to obtain a smooth surface. When the thickness of the fluororesin layer is at most the upper limit value in the above range, a curling or wrinkling problem likely to occur during the cooling, will be unlikely to occur.

$Rz_{JIS}$ of the surface of the fluororesin layer in the fluororesin layer-coated metal foil and the fluororesin layer-coated heat resistant resin film, is preferably from 0.05 to 3.0 μm, more preferably from 0.2 to 2.0 μm. When $Rz_{JIS}$ of the surface of the fluororesin layer is at least the lower limit value in the above range, interlayer air will be suitably withdrawn during lamination, and air bubbles to be contained between the layers of the fluororesin layer and the heat-resistant resin layer, and the fluororesin layer and the metal layer after lamination, will decrease. When $Rz_{JIS}$ of the surface of the fluororesin layer is at most the upper limit value in the above range, the fluororesin layer will properly wettingly spread on the surface of the heat-resistant resin layer and the metal layer during lamination, whereby adhesion between the fluororesin layer and the heat-resistant resin layer and between the fluororesin layer and the metal layer after lamination, will be further excellent.

The wetting tension of the surface of the fluororesin layer in the fluororesin layer-coated metal foil and the fluororesin layer-coated heat-resistant resin film, is less than 22.6 mN/m if no surface treatment is applied, but, in a case where surface treatment is applied, it is preferably from 30 to 70 mN/m, more preferably from 40 to 65 mN/m. When the wetting tension of the surface of the fluororesin layer is in the above range, adhesion between the fluororesin layer and the heat-resistant resin layer and between the fluororesin layer and the metal layer after lamination, will be further excellent.

(Surface Treatment)

Surface treatment may be applied to the fluororesin layer and the heat-resistant resin film in the fluororesin layer-coated metal foil and the fluororesin layer-coated heat-resistant resin film.

The surface treatment may be a treatment for increasing the wetting tension of the treated surface. The surface treatment may be discharge treatment such as corona discharge treatment, plasma treatment (atmospheric pressure plasma discharge treatment, vacuum plasma discharge treatment, etc. but excluding the corona discharge treatment), etc., light ray irradiation treatment such as a plasma graft polymerization treatment, electron beam irradiation, excimer UV irradiation, etc., ITRO treatment using flame, wet etching treatment using metal sodium, etc. Adhesive groups will be formed on the surface of the fluororesin layer by the surface treatment, whereby the wet tension will be increased.

As the surface treatment, from such a viewpoint that the economical efficiency will be good, and it will be easy to obtain a desired wetting tension, discharge treatment is preferred; corona discharge treatment, atmospheric pressure plasma discharge treatment and vacuum plasma discharge treatment are more preferred; and from such a viewpoint that it will be possible to improve the adhesion strength, atmospheric pressure plasma discharge treatment and vacuum plasma discharge treatment are particularly preferred. In the discharge treatment, by bringing the environment during the discharge to be in the presence of oxygen gas, oxygen radicals or ozone will be generated, whereby adhesive groups may be efficiently introduced to the surface of the fluororesin layer.

The corona discharge treatment can be carried out by using a known apparatus.

The discharge power density of the corona discharge treatment is preferably from 10 to 200 W·min/m². When the discharge power density is within the above range, the wetting tension of the surface of the fluororesin layer is likely to be within the above range.

The gas for the corona discharge treatment portion may be the atmospheric air, but nitrogen gas, argon gas, oxygen gas, helium gas, polymerizable gas (such as ethylene) or the like may be added.

The absolute humidity at the corona discharge treatment portion is preferably from 10 to 30 g/m³. When the absolute humidity is at least 10 g/m³, discharge can be conducted stably with no generation of sparks. When the absolute humidity is at most 30 g/m³, the change in the discharge amount will be small, and the wetting tension can easily be made uniform.

The vacuum plasma discharge treatment can be carried out by using a known apparatus.

As the vacuum plasma discharge treatment, from the viewpoint of treatment efficiency, a glow discharge treatment of continuously discharging at a gas pressure of from 0.1 to 1,330 Pa (preferably from 1 to 266 Pa), i.e. a so-called low-temperature plasma treatment, is preferred. By applying a power of from 10 W to 100 kW at a frequency of from 10 kHz to 2 GHz between the discharge electrodes under such a gas pressure, it is possible to carry out a stable glow discharge.

The discharge power density in the vacuum plasma discharge treatment is preferably from 5 to 400 W·min/m². When the discharge power density is within the above range, the wetting tension of the surface of the fluororesin layer will be likely to be within the above range.

The gas to be used for the vacuum plasma discharge treatment may be helium gas, neon gas, argon gas, nitrogen gas, oxygen gas, carbon dioxide gas, hydrogen gas, air, steam or the like. As the gas, two or more types may be used as mixed. As the gas, from the viewpoint of improvement in adhesion strength, a mixed gas of argon gas, carbon dioxide gas, oxygen gas or nitrogen gas and hydrogen gas, is preferred, and a mixed gas of argon gas and hydrogen gas, is more preferred. As the gas flow rate during treatment, from 500 to 10,000 sccm is preferred.

The atmospheric pressure plasma discharge treatment can be carried out by using a known apparatus.

In the atmospheric pressure plasma discharge treatment, grow discharge is generated by discharging in the presence of an inert gas (argon gas, nitrogen gas, helium gas, etc.) under from 0.8 to 1.2 atm. A trace amount of active gas (oxygen gas, hydrogen gas, carbon dioxide, ethylene, tetrafluoroethylene, etc.) is mixed in the inert gas. As the gas, from such a viewpoint that the wetting tension of the surface of the fluororesin layer will be likely to be within the above range, a gas having hydrogen gas mixed to nitrogen gas, is preferred.

The voltage in the atmospheric pressure plasma discharge treatment is usually from 1 to 10 kV. The frequency of the power source is usually from 1 to 20 kHz. The treating time is usually from 0.1 second to 10 minutes.

The discharge power density of the atmospheric pressure plasma discharge treatment is preferably from 5 to 400 W·min/m$^2$. When the discharge power density is within the above range, the wetting tension of the surface of the fluororesin layer will be likely to be within the above range.

In the case of laminating the fluororesin layer-coated metal foil and a heat-resistant resin film, it is preferred that the surface in contact with the fluororesin layer, of the heat-resistant resin film, is surface-treated. The surface treatment may be the above-described discharge treatment, or a primer treatment of applying a silane coupling agent or the like.

The water contact angle of the surface of the heat-resistant resin film, after the surface treatment, is preferably from 5° to 60°, more preferably from 10 to 50°, further preferably from 10° to 30°. Within this range, adhesion between the fluororesin layer and the heat-resistant resin layer after lamination will be further excellent.

For example, in a case where the heat-resistant resin film is an aromatic polyimide film, the water contact angle of the surface of the aromatic polyimide film is from 70° to 80° before the surface treatment, but it is preferred to control it so that it will be within the above range after the surface treatment.

The water contact angle is a value measured by the sessile drop method described in JIS R 3257: 1999.

Among various surface treatments, atmospheric pressure plasma discharge treatment, or vacuum plasma discharge treatment is preferred from the viewpoint of improving the adhesion strength.

Further, the proportion (atom %) of oxygen atoms at the heat-resistant resin film surface after the surface treatment preferably becomes to be from 1.1 to 3.0 times the proportion (atom %) of oxygen atoms at the heat-resistant resin film surface before the surface treatment. The proportion (atom %) of nitrogen atoms at the heat-resistant resin film surface after the surface treatment preferably becomes to be from 1.1 to 2.0 times the proportion (atom %) of nitrogen atoms at the heat-resistant resin film surface before the surface treatment. In such a case, cleavage of the main chain of the heat-resistant resin and formation of a low molecular weight product (a decomposition product of the heat-resistant resin, etc.) at the heat-resistant resin film surface, by the surface treatment, will be suppressed, whereby adhesion between the heat-resistant resin film and the fluororesin layer will be further improved.

(Lamination)

Figure 4:
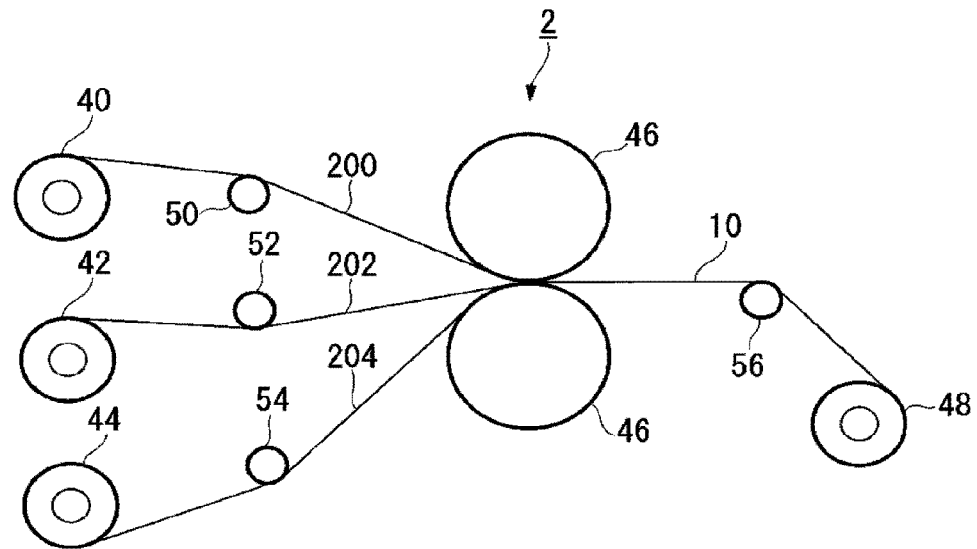
FIG. 4 is a schematic diagram showing an example of a heat lamination machine.

FIG. 4 is a schematic diagram showing an example of a heat lamination machine.

The heat lamination machine 2 comprises a first unwinding roll 40 on which a long first substrate 200 is wound, a second unwinding roll 42 on which a long second substrate 202 is wound, a third unwinding roll 44 on which a long third substrate 204 is wound, a pair of metal rolls 46 to laminate the first substrate 200, the second substrate 202 and the third substrate 204 to form a long laminate 10, a winding roll 48 to wind up the long laminate 10, a guide roll 50 to direct the first substrate 200 unwound from the first unwinding roll 40 towards the pair of metal rolls 46, a guide roll 52 to direct the second substrate 202 unwound from the second unwinding roll 42 towards the pair of metal rolls 46, a guide roll 54 to direct the third substrate 204 unwound from the third unwinding roll 44 towards the pair of metal rolls 46, and a guide roll 56 to direct the long laminate 10 that has passed through the pair of metal rolls 46 towards the winding roll 48.

Figure 5:
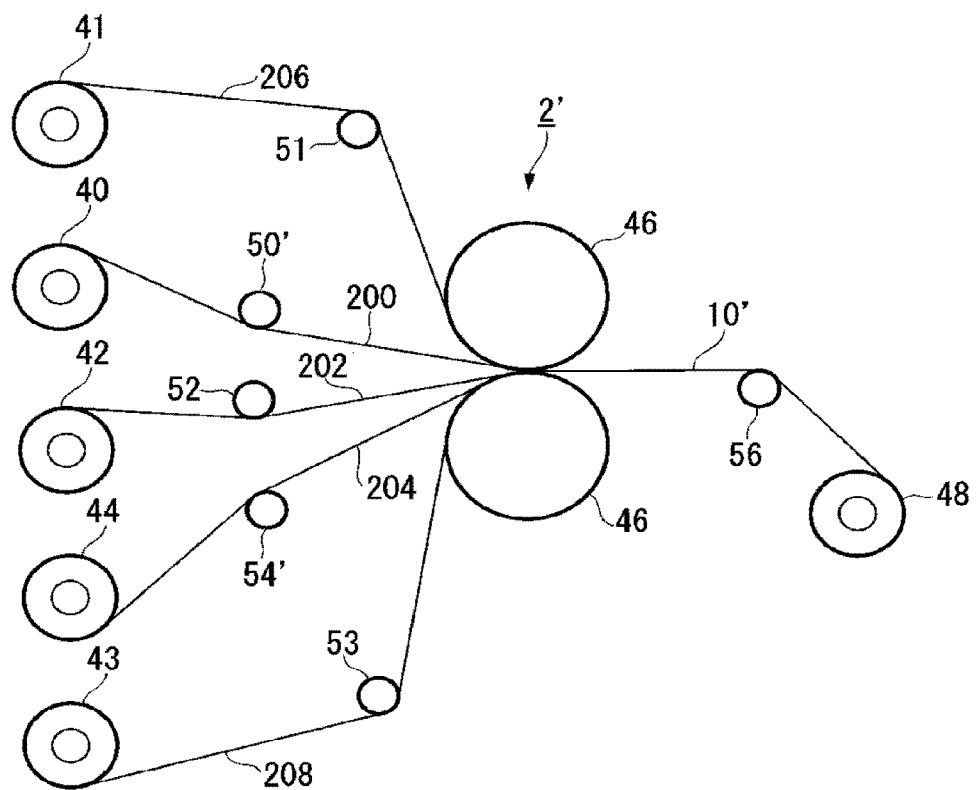
FIG. 5 is a schematic diagram showing another example of a heat lamination machine.
Figure 6:
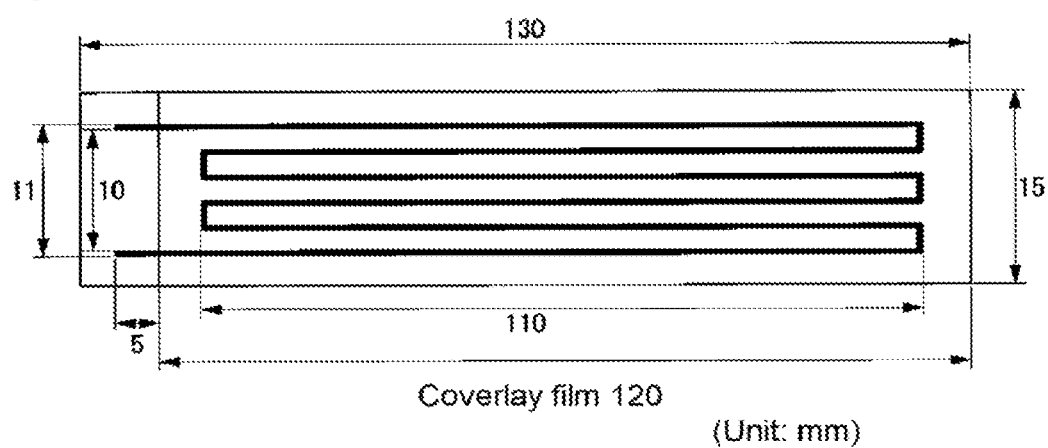
FIG. 6 is a top view of a test specimen to be used for a folding endurance test.

FIG. 5 is a schematic diagram showing another example of a heat lamination machine.

The heat lamination machine 2' comprises a first unwinding roll 40 on which a long first substrate 200 is wound, a second unwinding roll 42 on which a long second substrate 202 is wound, a third unwinding roll 44 on which a long third substrate 204 is wound, a fourth unwinding roll 41 on which a long fourth substrate 206 is wound, a fifth unwinding roll 43 on which a long fifth substrate 208 is wound, a pair of metal rolls 46 to laminate the first substrate 200, the second substrate 202, the third substrate 204, the fourth substrate 206 and the fifth substrate 208 to form a protective layer-coated long laminate 10', a winding roll 48 to wind up the protective layer-coated long laminate 10', a guide roll 50' to direct the first substrate 200 unwound from the first unwinding roll 40 towards the pair of metal rolls 46, a guide roll 52 to direct the second substrate 202 unwound from the second unwinding roll 42 towards the pair of metal rolls 46, a guide roll 54' to direct the third substrate 204 unwound from the third unwinding roll 44 towards the pair of metal rolls 46, a guide roll 51 to direct the fourth substrate 206 unwound from the fourth unwinding roll 41 towards the pair of metal rolls 46, a guide roll 53 to direct the fifth substrate 208 unwound from the fifth unwinding roll 43 towards the pair of metal rolls 46, and a guide roll 56 to direct the protective layer-coated long laminate 10' having passed through the pair of metal rolls 46, towards the winding roll 48.

The fourth substrate 206 is, before being laminated with the first substrate 200, preferably brought into contact with the metal roll 46 and preheated as being in contact with the metal roll 46. Similarly, the fifth substrate 208 is, before being laminated with the third substrate 204, preferably brought in contact with the metal roll 46 and preheated as being in contact with the metal roll 46. Further, with a view to preventing warpage or undulation of the fluororesin layer by rapid cooling, the protective layer is preferably conveyed and gradually cooled for at least 5 seconds in the overlapped state after the lamination.

The pair of metal rolls 46 are provided with a heating mechanism, whereby it is possible to adjust the roll surface temperature to an optional temperature. A roll provided with a heating mechanism may be an electric heating roll, a heating medium circulation type roll, an induction heating roll, etc.

The surface of the metal roll 46 preferably has a Shore hardness of at least Hs50. In such a case, it tends to be easy to prevent scratching of the roll surface due to rapid formation of a difference in level due to a deposit (metal scrap or the like) on the surface of the laminate roll being a metal, or due to bending of the substrate. On the surface of the metal roll, industrial chrome plating is preferably applied on the metal matrix, from the viewpoint of abrasion resistance, non-tackiness, heat resistance, etc. In such a case, normally, the original hardness of the metal matrix at a level of from Hs20 to 30 tends to increase to a level of at least Hs50. Here, the thickness of industrial chrome plating is preferably at least 0.05 mm, with a view to preventing formation of cracks by use at high temperatures for a long time.

The appearance dimensions of the upper and lower two metal rolls 46 are respectively preferably such that the roundness is at most 0.05 mm, the cylindricity is at most 0.05 mm, and the surface roughness is at most 0.01 mm. In such a case, the space between the upper and lower metal rolls as combined can easily be controlled to be at most 0.1 mm, and in a case where the thicknesses of the respective substrates are at most 0.1 mm, it will be easy to suppress the pressure unevenness and to conduct uniform pressure lamination. Further, in a case where the surface roughness is at most 0.01 mm, it will be easy to conduct uniform pressure lamination.

Further, in order to reduce the temperature distribution in the width direction, a metal roll 46 preferably has a heat pipe encapsulating a heat medium. Here, the temperature distribution is preferably at most 10° C., particularly preferably at most 6° C. In such a case, it will be easy to conduct uniform pressure lamination by suppressing the temperature crown. The diameter of the metal roll 46 is preferably from 200 to 1,000 mm, with a view to suppressing the deflection of the roll and the pressing pressure by the weight during the pressing.

The respective unwinding rolls will control the unwinding speeds of the respective substrates, whereby it is possible to control the tensions applied to the respective substrates to be transported to the pair of metal rolls 46.

Further, with a view to reducing wrinkles for the first substrate 200, the second substrate 202 and the third substrate 204, respectively, it is preferred not to raise their temperatures until they will contact the metal rolls 46.

A substrate having the fluororesin layer is prone to warpage or wrinkles due to heating, and therefore, in order not to receive the radiation heat of the metal rolls 46, the approach angle to the metal rolls 46 is preferably from 85 to 95 to the center line of the pair of metal rolls 46. The approach angle may be controlled by installing two or more guide rolls 52.

Further, it is preferred to dispose a heat shield plate between the guide roll 52 and the metal rolls 46, and to further cool the guide roll 52. With a view to shortening the inter-roll transport distance to suppress wrinkles of the substrate having a fluororesin layer, the distance between the guide roll 52 and the metal rolls 46 is preferably at most 1 m, particularly preferably at most 50 cm. Further, the respective guide rolls preferably have a mechanism capable of finely adjusting their angles, with a view to suppressing the transport wrinkles.

On the other hand, in a case where the second substrate 202 is a polyimide, with a view to suppressing void defects at the time of lamination, it is preferred to provide an infrared heater immediately after the second unwinding roll 42, to heat the second substrate 202 to evaporate and remove water. The temperature of the infrared heater is preferably from 100° C. to 300° C.

The heat lamination machine is not limited to the illustrated examples. For example, after the feed roll, an adhesive roll for the purpose of removing foreign substances may be disposed. Further, it is possible to dispose a dancer roll to reduce vibration of the tension. Further, it is possible to dispose an expander roll to reduce wrinkles immediately before lamination. Further, in order to improve adhesion, an infrared heater may be disposed between substrates before the laminating rolls to preheat the substrates to such an extent that wrinkles will not be deteriorated. So that even if there is winding deviation in the substrate, it is possible to correct it, EPC (edge position control device) may be disposed at the feeding section. Further, in particular, since the fluorolayer is likely to be electrified and attract foreign substances, a static eliminator may be disposed. Further, for the purpose of thermal insulation around the metal rolls 46, they may be surrounded by a material having a thermal insulation. Further, for the purpose of preventing oxidation of the metal layer, nitrogen may be flown in the enclosure. Each of the above apparatuses may be disposed at a plurality of locations.

Further, instead of the pair of metal rolls, a pair of endless belts may be used. The third unwinding roll may be omitted, so that the first substrate and the second substrate may be laminated.

By using a heat lamination machine, the fluororesin layer-coated metal foil and a substrate containing a heat-resistant resin film are laminated, or the fluororesin layer-coated heat-resistant resin film and a substrate having a metal foil are laminated.

The substrate containing a heat-resistant resin film may be a heat-resistant resin film alone, or a laminate of three-layer structure being a metal layer/fluororesin layer/heat-resistant resin layer, may be mentioned. The laminate of three-layer structure may be a long laminate of the present invention, or one obtained by applying a polyimide precursor varnish to the fluororesin layer-coated metal foil, and imidizing the precursor.

The substrate containing a metal foil may be a metal foil alone, or a laminate of a two-layer structure being a metal layer/polyimide layer.

The combination of the first substrate, the second substrate and the third substrate may, for example, be combinations in Table 1.

TABLE 1

| First substrate | Second substrate | Third substrate | Layer structure of obtainable long laminate |
|---|---|---|---|
| Metal foil | Fluororesin layer-coated heat-resistant resin film | — | Metal layer/ fluororesin layer/ heat-resistant resin layer |
| Fluororesin layer-coated metal foil | Heat-resistant resin film | — | Metal layer/ fluororesin layer/ heat-resistant resin layer |
| Metal foil | Both side fluororesin layer- | Metal foil | Metal layer/ fluororesin layer/ |

TABLE 1-continued

| First substrate | Second substrate | Third substrate | Layer structure of obtainable long laminate |
|---|---|---|---|
| | coated heat-resistant film | | heat-resistant resin layer/ fluororesin layer/ metal layer |
| Fluororesin layer-coated metal foil | Heat-resistant resin film | Fluororesin layer-coated metal foil | Metal layer/ fluororesin layer/ heat-resistant resin layer/ fluororesin layer/ metal layer |
| Fluororesin layer-coated metal foil | Laminate of three layer structure | — | Metal layer/ fluororesin layer/ heat-resistant resin layer/ fluororesin layer/ metal layer |

As the fourth substrate and the fifth substrate, for example, a film for a protective layer may be mentioned.

The surface temperature (lamination temperature) of the pair of metal rolls is preferably from 310 to 360° C., more preferably from 320 to 340° C. When the surface temperature of the pair of metal rolls is at least the lower limit value in the above range, adhesion between the fluororesin layer and the heat-resistant resin layer and between the fluororesin layer and the metal layer will be further excellent. When the surface temperature of the pair of metal rolls is at most the upper limit value in the above range, it is possible to suppress curling or wrinkles of the long laminate. The surface temperature of the pair of metal rolls is the temperature obtained by measuring the roll surface by a contact thermocouple.

The pressure between the pair of metal rolls, i.e. the pressing pressure at the time of laminating the respective substrates is preferably from 15 to 80 kN/m, more preferably from 20 to 70 kN/m. When the pressing pressure is at least the lower limit value in the above range, adhesion between the fluororesin layer and the heat-resistant resin layer and between the fluororesin layer and the metal layer will be further excellent.

When the pressing pressure is at most the upper limit value in the above range, wrinkles of the long laminate will be suppressed.

The conveying speed (laminating speed) of each substrate is usually from 0.5 to 5.0 m/min.

The tension exerted on each substrate is usually from 100 to 800 N.

(Heat Treatment)

The obtained long laminate may further be subjected to heat treatment for the purpose of improving the adhesive strength. Specifically, the long laminate is treated by being put in an oven of at least 300° C. under nitrogen gas in a wound-up state, or treated by passing the long laminate by roll-to-roll in a furnace which can be heated to at least 300° C. under nitrogen gas.

(Advantageous Effects)

In the method for producing a long laminate of the present invention as described above, while conveying a long metal foil or a long heat-resistant resin film containing a heat-resistant resin, a liquid composition is applied to the metal foil or heat-resistant resin film to form a wet film, and while conveying the long wet film-coated metal foil or heat-resistant resin film, the wet film is heated to form a fluororesin layer thereby to obtain a fluororesin layer-coated metal foil or a fluororesin layer-coated heat-resistant resin film, whereby, by using it, it is possible to produce a long laminate having a thin film fluororesin layer having no wrinkles.

<Printed Wiring Board>

The printed wiring board of the present invention is one obtained by processing the long laminate of the present invention.

The printed wiring board of the present invention can be produced, for example, by the following method.

A method of processing the metal layer in the long laminate of the present invention into a conductor circuit of a predetermined pattern by etching, etc.

A method for forming a conductor circuit by electroplating by a semi-additive method (SAP method) or modified semi-additive method (MSAP method) by using the long laminate of the present invention.

In the production of a printed wiring board, after forming a conductor circuit, an interlayer insulating film may be formed on the conductor circuit, and on the interlayer insulating film, a conductor circuit may further be formed. The interlayer insulating film may be formed, for example, by the liquid composition used in the production method of the present invention.

In the production of a printed wiring board, on the conductor circuit, a solder resist may be laminated. The solder resist may be formed, for example, by the liquid composition used in the production method of the present invention.

In the production of a printed wiring board, on the conductor circuit, a coverlay film may be laminated.

The printed wiring board of the invention as described above is one made by processing the long laminate of the present invention, whereby it is possible to accomplish both thinning of the resin layer and speeding up of signal transmission; the dimension stability and folding endurance of the resin layer will be excellent; and there will be no wrinkles in the fluororesin layer.

EXAMPLES

In the following, the present invention will be described in detail with reference to Examples, but the present invention is not limited thereto.

Ex. 1 to 15, 19 and 20 are Examples of the present invention, and Ex. 16 to 18 are Comparative Examples.

(Proportions of the Respective Units in the Fluorinated Polymer)

The proportion of NAH units in the fluorinated polymer was obtained by the following infrared absorption spectrum analysis. The proportions of units other than NAH units were obtained by the melt NMR analysis and fluorine content analysis.

(Infrared Absorption Spectroscopy)

A fluorinated polymer was press-molded to obtain a film having a thickness of 200 μm. The film was analyzed by infrared spectroscopy to obtain an infrared absorption spectrum. In the infrared absorption spectrum, the absorption peak of NAH units in the fluorinated polymer appears at 1,778 cm$^{-1}$. The absorbance of this absorption peak was measured, whereupon using the molar absorption coefficient 20,810 mol$^{-1}$·L·cm$^{-1}$ of NAH, the proportion of NAH units in the fluorinated polymer was obtained.

(Melting Point)

By using a differential scanning calorimeter (manufactured by Seiko Instruments Inc., DSC-7020), the melting peak at the time when the fluorinated polymer was heated at a rate of 10° C./min, was recorded, whereupon the temperature (° C.) corresponding to the maximum value was adopted as the melting point.

(MFR)

By using a melt indexer (manufactured by Techno Seven Co., Ltd.), the mass (g) of the fluorinated polymer to flow in 10 minutes from a nozzle with a diameter of 2 mm and a length of 8 mm at 372° C. under a load of 49N, was measured and adopted as MFR.

(Relative Permittivity of the Fluorinated Polymer)

The relative permittivity of the fluorinated polymer was measured by the SPDR method, at a frequency of 2.5 GHz under an environment at 23° C.±2° C., in the range of RH of 50±5%.

(D50 of the Fluorinated Polymer)

Screens were overlaid in order from the top, 2.000 mesh sieve (mesh opening: 2.400 mm), 1.410 mesh sieve (mesh opening: 1.705 mm), 1.000 mesh sieve (mesh opening: 1.205 mm), 0.710 mesh sieve (mesh opening: 0.855 mm), 0.500 mesh sieve (mesh opening: 0.605 mm), 0.250 mesh sieve (mesh opening: 0.375 mm), 0.149 mesh sieve (mesh opening: 0.100 mm). Into the top sieve, the fluorinated polymer was put, and sieved by a shaker for 30 minutes. The masses of the fluorinated polymer remained on the respective sieves were measured, and the cumulative passing weights corresponding to the respective sieve opening values are represented in a graph, whereupon a particle size where the cumulative passing mass became 50% was obtained and adopted as D50 of the fluorinated polymer.

(D50 and D90 of the Resin Powder)

By using a laser diffraction scattering particle size distribution analyzer (manufactured by HORIBA, Ltd., LA-920 instrument), the resin powder was dispersed in water and the particle size distribution was measured, whereupon D50 and D90 were calculated.

(Loosely Packed Bulk Density and Densely Packed Bulk Density)

The loosely packed bulk density and densely packed bulk density of the resin powder were measured by the method described in paragraphs [0117] and [0118] of WO 2016/017801.

($Rz_{JIS}$)

The ten-point average roughness $Rz_{JIS}$ was measured in accordance with annex JA of JIS B 0601: 2013. The standard length lr (cut-off value λc) for the roughness curve was set to be 0.8 mm. The feeler tip radius was set to be 2 μm, the taper angle was set to be 90 degrees, the measurement speed was set to be 1.0 mm/sec, and the measuring length was set to be 10 mm.

(Proportion of the Dispersing Agent)

From the long laminate, the fluororesin layer-coated metal foil or the fluorine resin layer-coated heat-resistant resin film, a test specimen of 10 cm×10 cm was cut out. In a case where the test specimen had a copper foil, the copper foil was removed by etching using an aqueous solution of copper chloride. The test specimen was dried at 120° C. for 1 hour in a circulating hot air oven to remove water. The mass of the test specimen after drying was promptly measured. It was further heated at 250° C. for two hours in the circulating hot air oven. The mass of the test specimen after heating was promptly measured. The proportion of the dispersing agent was obtained from the following formula.

Proportion of the dispersing agent={(mass before heating at 250° C.−mass after heating at 250° C.)/mass before heating at 250° C.}×100

(Wetting Tension)

The wetting tension of the surface of the fluororesin layer was obtained in accordance with JIS K 6768: 1999 by using a wetting tension test liquid mixture (manufactured by Wako Pure Chemical Industries, Ltd.).

(Adhesive Strength)

From the long laminate, a rectangular test specimen with a length of 100 mm and a width of 10 mm was cut out. The heat-resistant resin layer was peeled from the fluororesin layer from one end in the longitudinal direction of the test specimen to the position at 50 mm. By setting the 50 mm position from one end in the longitudinal direction of the test specimen as the center, by means of a tensile tester (manufactured by ORIENTEC CORPORATION), it was peeled at 90 degrees at a tensile rate of 50 mm/min, whereby the average load in the measured distance of from 10 mm to 30 mm was adopted as the adhesive strength (N/10 mm). The higher the adhesive strength, the better the adhesion.

(Dimensional Change Rate)

The dimensional change rate of the long laminate was obtained in accordance with JIS C 6471: 1995 (corresponding international standard IEC 249-1: 1982). From the long laminate, a test specimen of 240 mm×300 mm was cut out. The MD dimension and TD dimension before etching of the test specimen were measured. With respect to the test specimen, the copper foil was removed by etching, and after heating at 150° C. for 30 minutes, the MD dimension and TD dimension were measured. The dimensional change rate was calculated from the following formula.

MD dimensional change rate (%)={(MD dimension after heating−MD dimension before etching)/MD dimension before etching}×100

TD dimensional change rate (%)={(TD dimension after heating−TD dimension before etching)/TD direction dimension before etching}×100

Dimensional change rate (%)=(MD dimensional change rate+TD dimensional change rate)/2

(Relative Permittivity of the Resin Layer)

From the long laminate, a test specimen was cut out. With respect to the test specimen, after removing the copper foil by etching by using an aqueous solution of copper chloride, the relative permittivity was measured by using the Fabry-Perot resonator and the vector network analyzer (manufactured by KEYCOM Corporation).

(Folding Endurance)

The folding endurance of the long laminate was evaluated based on JIS C 6471: 1995 (corresponding International Standard IEC 249-1: 1982). From a long laminate, a test specimen of 130 mm×15 mm was cut out. With respect to the test specimen, a conductor circuit having a pattern and size shown by a thick line in FIG. 6 was formed by etching. Coverlay films of 120 mm×15 mm (manufactured by NIKKAN INDUSTRIES CO., LTD., NIKAFLEX (registered trademark) CKSE, base film thickness: 25 μm, the adhesive layer thickness: 25 μm) were laminated on both sides of the test specimen by a quick press.

Under conditions of folding speed: 175 times/min, folding angle: 135 degrees, tension: 4.9N, clamping curvature radius: 2 mm, and clamping gap: 0.1 mm, the test piece was folded while energizing the conductor circuit, and the number of folding times until the conductive circuit broke down, was measured.

(Bubbles)

The long laminate was unwound from the winding roll, whereby the appearance of the portion corresponding to a length 5 m was visually confirmed, and whether or not interlayer peeling (bubbles) is observed, was confirmed. Further, in a case where the peeling was observed, by a microscope, the diameter of a perfect circle converted peeling section was measured. The results were judged by the following standards.

◯: Peeling is not observed.

Δ: Peeling with a diameter of less than 1 mm is observed at at least one location and less than 10 locations, and no peeling with a diameter of at least 1 mm is observed.

×: Either peeling with a diameter of less than 1 mm is observed at at least 10 locations, or peeling with a diameter of at least 1 mm is observed at at least one location.

(Resin Powder)

Using TFE, NAH (manufactured by Hitachi Chemical Co., Ltd., Nadic anhydride) and PPVE (manufactured byAsahi Glass Company, Limited), fluorinated polymer A-1 was produced by the procedure as described in paragraph [0123] of WO 2016/017801. In the fluorinated polymer A-1, the proportions of the respective units were NAH units/TFE units/PPVE units=0.1/97.9/2.0 (mol %). The melting point of the fluorinated polymer A-1 was 300° C., MFR was 17.6 g/10 min, the relative permittivity was 2.1, and D50 was 1,554 μm.

Using a jet mill (manufactured by SEISHIN ENTERPRISE CO., LTD., single track jet mill FS-4 type), the fluorinated polymer A-1 was pulverized under conditions of a grinding pressure: 0.5 MPa and treating speed: 1 kg/hr, to obtain resin powder P-1. D50 of the resin powder P-1 was 2.58 μm, and D90 was 7.1 μm. The loosely packed bulk density of the resin powder P-1 was 0.278 g/mL, and the densely packed bulk density was 0.328 g/mL.

(Copper Foil)

Copper foil-1: manufactured by JX Nippon Mining & Metals Corporation, rolled copper foil, GHY5-93F-HA-V2, thickness: 12 μm, $Rz_{JIS}$: 0.35 μm.

(Heat-Resistant Resin Film)

Polyimide film-1: manufactured by Du Pont-Toray Co., Ltd. Kapton (registered trademark) 20EN, thickness: 5 μm.

Polyimide film-2: manufactured by Ube Industries, Ltd., UPILEX (registered trademark) 12.5NVT, thickness: 12.5 μm.

Polyimide film-3: manufactured by Ube Industries, Ltd., UPILEX (registered trademark) 25NVT, thickness: 25 μm.

Polyimide film-4: manufactured by Ube Industries, Ltd., UPILEX (registered trademark) 50NVT, thickness: 50 μm.

Polyimide film-5: manufactured by Ube Industries, Ltd., one obtained by subjecting UPILEX (registered trademark) 25S having a thickness of 25 μm to corona treatment at a discharge amount of 30 W/(m²-min).

Polyimide film-6: manufactured by Ube Industries, Ltd., UPILEX (registered trademark) 25SGA, thickness: 25 μm. One obtained by applying a silane coupling agent to UPILEX (registered trademark) 25S.

Polyimide film-7: manufactured by Ube Industries, Ltd., one obtained by subjecting UPILEX (registered trademark) 25S having a thickness of 25 μm to atmospheric pressure plasma treatment under the following conditions. Plasma treatment conditions: gas type: 99.0 atm % of argon gas, 0.5 atm % of nitrogen gas and 0.5 atm % of hydrogen gas; treating frequency: 30 kHz; pressure: 102 kPa; discharge power density: 300 W·min/m².

Polyimide film-8: manufactured by Ube Industries, Ltd., one obtained by subjecting UPILEX (registered trademark) 25S having a thickness of 25 μm, to vacuum plasma treatment under the following conditions. Plasma treatment conditions: gas type: 99.0 atm % of argon gas, 0.5 atm % of nitrogen gas and 0.5 atm % of hydrogen gas; treating frequency: 30 kHz: pressure: 20 Pa; discharge power density: 300 W·min/m².

Liquid crystal polymer film-1: manufactured by Kuraray Co., Ltd., VECSTAR (registered trademark) 25CT-Q, thickness: 25 μm.

Liquid crystal polymer film-2: a film obtained by subjecting liquid crystal polymer film-1 to vacuum plasma treatment under the following conditions. Plasma treatment conditions: gas type: 95 atm % of argon gas and 5 atm % hydrogen gas; treating frequency: 50 kHz; pressure: 35 Pa; discharge power density: 300 W·min/m².

The tensile modulus at 260° C. of each of these heat-resistant resin films is at least 108 Pa.

Production Example 1

120 g of the resin powder P-1, 12 g of a nonionic surfactant (manufactured by NEOS COMPANY LIMITED, Ftergent 710FL) and 234 g of methyl ethyl ketone were charged into a horizontal ball mill pot, and the resin powder P-1 was dispersed by zirconia balls of 15 mm diameter to obtain a liquid composition. The liquid composition was applied by roll-to-roll to the surface of the long copper foil-1 by means of a die coater, dried at 100° C. for 15 minutes under a nitrogen gas atmosphere, continuously fired at 350° C. for 5 minutes under a nitrogen gas atmosphere, followed by annealing to obtain a long fluororesin layer-coated copper foil-1. The results are shown in Table 2.

Production Example 2

A long fluororesin layer-coated copper foil-2 was obtained in the same manner as in Production Example 1 except that the thickness of the fluororesin layer was changed. The results are shown in Table 2.

Production Example 3

A long fluororesin layer-coated copper foil-3 was obtained in the same manner as in Production Example 1 except that the thickness of the fluororesin layer was changed. The results are shown in Table 2.

Production Example 4

A long fluororesin layer-coated copper foil-4 was obtained in the same manner as in Production Example 1 except that the heating time in the firing was changed to 4 minutes. The results are shown in Table 2.

Production Example 5

A long fluororesin layer-coated copper foil-5 was obtained in the same manner as in Production Example 1 except that the heating time in the firing was changed to 8 minutes. The results are shown in Table 2.

Production Example 6

The long fluororesin layer-coated copper foil-1 was roll-pressed by two metal rolls ($Rz_{JIS}$ of the surface: 0.1 μm) heated to 200° C. to obtain a long fluororesin layer-coated copper foil-6. The results are shown in Table 2.

Production Example 7

The long fluororesin layer-coated copper foil-1 was roll-pressed by two metal rolls ($Rz_{JIS}$ of the surface: 3.0 μm) heated to 200° C. to obtain a long fluororesin layer-coated copper foil-7. The results are shown in Table 2.

Production Example 8

The long fluororesin layer-coated copper foil-1 was subjected to atmospheric pressure plasma discharge treatment under the following conditions by roll-to-roll to obtain a long fluororesin layer-coated copper foil-8. The results are shown in Table 2.
  Gas type: 99.0 atm % of Ar gas, 0.5 atm % of nitrogen gas and 0.5 atm % of hydrogen gas,
  Treating frequency: 30 kHz,
  Pressure: 102 kPa,
  Discharge power density: 300 W·min/m².

Production Example 9

The long fluororesin layer-coated copper foil-1 was subjected to vacuum plasma discharge treatment under the following conditions by roll-to-roll to obtain a long fluororesin layer-coated copper foil-9. The results are shown in Table 2.
  Gas type: 99.0 atm % of Ar gas, 0.5 atm % of nitrogen gas and 0.5 atm % of hydrogen gas,
  Treating frequency: 30 kHz,
  Pressure: 20 Pa,
  Discharge power density: 300 W·min/m².

Production Example 10

A fluororesin layer having a thickness of 5 μm was formed on the surface of the long polyimide film-2 in the same manner as in Production Example 1. A fluororesin layer having a thickness of 5 μm was formed in the same manner also on the surface at the opposite side of the polyimide film-2 to obtain a long both side fluororesin layer-coated polyimide film-1. The results are shown in Table 2.

TABLE 2

|  | Production Example 1 Fluororesin layer-coated copper foil-1 | Production Example 2 Fluororesin layer-coated copper foil-2 | Production Example 3 Fluororesin layer-coated copper foil-3 | Production Example 4 Fluororesin layer-coated copper foil-4 | Production Example 5 Fluororesin layer-coated copper foil-5 |
| --- | --- | --- | --- | --- | --- |
| Thickness of fluororesin layer (μm) | 5 | 2 | 10 | 5 | 5 |
| $Rz_{JIS}$ of fluororesin layer (μm) | 1.5 | 1.5 | 1.5 | 1.5 | 1.5 |
| Proportion of dispersing agent (mass %) | 1 | 1 | 1 | 2 | 0.1 |
| Wetting tension (mN/m) | <22.6 | <22.6 | <22.6 | <22.6 | <22.6 |

|  | Production Example 6 Fluororesin layer-coated copper foil-6 | Production Example 7 Fluororesin layer-coated copper foil-7 | Production Example 8 Fluororesin layer-coated copper foil-8 | Production Example 9 Fluororesin layer-coated copper foil-9 | Production Example 10 Both side fluororesin layer-coated polyimide film-1 |
| --- | --- | --- | --- | --- | --- |
| Thickness of fluororesin layer (μm) | 5 | 5 | 5 | 5 | 5 × 2 |
| $Rz_{JIS}$ of fluororesin layer (μm) | 0.1 | 3 | 1.5 | 1.5 | 1.5 |
| Proportion of dispersing agent (mass %) | 1 | 1 | 1 | 1 | 1 |
| Wetting tension (mN/m) | <22.6 | <22.6 | 60 | 60 | <22.6 |

(Ex. 1)

By using the heat lamination machine having a structure as shown in FIG. 4, the first substrate: fluororesin layer-coated copper foil-1, the second substrate: polyimide film-2, and the third substrate: fluororesin layer-coated copper foil-1, were laminated so that the fluororesin layer and the polyimide film-2 were in contact under the following conditions to obtain a long laminate. The results are shown in Table 3.
  The surface temperature (lamination temperature) of the pair of metal rolls: 340° C.,
  Pressing force: 15 kN/m,
  Conveyor speed (laminating speed): 3 m/min,
  Tension applied to each substrate: 200N.

(Ex. 2 to 20)

A long laminate was obtained in the same manner as in Ex. 1, except that the first substrate, the second substrate and the third substrate were changed as shown in Table 3 to Table 6. The results are shown in Table 3 to Table 6.

TABLE 3

|  | Ex. 1 | Ex. 2 | Ex. 3 | Ex. 4 | Ex. 5 |
| --- | --- | --- | --- | --- | --- |
| First substrate | Fluororesin layer-coated copper foil-1 | Fluororesin layer-coated copper foil-2 | Fluororesin layer-coated copper foil-3 | Fluororesin layer-coated copper foil-3 | Fluororesin layer-coated copper foil-2 |
| Second substrate | Polyimide film-2 | Polyimide film-1 | Liquid crystal polymer film-1 | Polyimide film-3 | Polyimide film-2 |

TABLE 3-continued

|  | Ex. 1 | Ex. 2 | Ex. 3 | Ex. 4 | Ex. 5 |
| --- | --- | --- | --- | --- | --- |
| Third substrate | Fluororesin layer-coated copper foil-1 | Fluororesin layer-coated copper foil-2 | Fluororesin layer-coated copper foil-3 | Fluororesin layer-coated copper foil-3 | Fluororesin layer-coated copper foil-2 |
| Total thickness T1 (μm) of fluororesin layer | 10 | 4 | 20 | 20 | 4 |
| Total thickness T2 (μm) of heat-resistant resin layer | 12.5 | 5 | 25 | 25 | 12.5 |
| T1/T2 | 0.8 | 0.8 | 0.8 | 0.8 | 0.32 |
| T1 + T2 (μm) | 22.5 | 9 | 45 | 45 | 16.5 |
| Adhesive strength (N/cm) | 10 | 10 | 7 | 10 | 10 |
| Dimensional change (%) | −0.03 | −0.03 | −0.03 | −0.03 | −0.01 |
| Relative permittivity | 2.7 | 2.7 | 2.7 | 2.7 | 3.2 |
| Folding endurance (number of times) | >100000 | >100000 | 50000 | 50000 | >100000 |
| Bubbles | ◯ | ◯ | ◯ | ◯ | ◯ |
| Proportion of dispersing agent (mass %) | 0.5 | 0.5 | 0.5 | 0.5 | 0.5 |

TABLE 4

|  | Ex. 6 | Ex. 7 | Ex. 8 | Ex. 9 | Ex. 10 |
| --- | --- | --- | --- | --- | --- |
| First substrate | Fluororesin layer-coated copper foil-3 | Fluororesin layer-coated copper foil-4 | Fluororesin layer-coated copper foil-5 | Fluororesin layer-coated copper foil-6 | Fluororesin layer-coated copper foil-7 |
| Second substrate | Polyimide film-2 | Polyimide film-2 | Polyimide film-2 | Polyimide film-2 | Polyimide film-2 |
| Third substrate | Fluororesin layer-coated copper foil-3 | Fluororesin layer-coated copper foil-4 | Fluororesin layer-coated copper foil-5 | Fluororesin layer-coated copper foil-6 | Fluororesin layer-coated copper foil-7 |
| Total thickness T1 (μm) of fluororesin layer | 20 | 10 | 10 | 10 | 10 |
| Total thickness T2 (μm) of heat-resistant resin layer | 12.5 | 12.5 | 12.5 | 12.5 | 12.5 |
| T1/T2 | 1.6 | 0.8 | 0.8 | 0.8 | 0.8 |
| T1 + T2 (μm) | 32.5 | 22.5 | 22.5 | 22.5 | 22.5 |
| Adhesive strength (N/cm) | 10 | 7 | 10 | 10 | 7 |
| Dimensional change (%) | −0.1 | −0.03 | −0.03 | −0.03 | −0.03 |
| Relative permittivity | 2.5 | 3.2 | 2.6 | 2.7 | 2.7 |
| Folding endurance (number of times) | 70000 | >100000 | >100000 | >100000 | >100000 |
| Bubbles | ◯ | ◯ | Δ | Δ | ◯ |
| Proportion of dispersing agent (mass %) | 0.5 | 1.0 | 0.0 | 0.5 | 0.5 |

TABLE 5

|  | Ex. 11 | Ex. 12 | Ex. 13 | Ex. 14 | Ex. 15 |
| --- | --- | --- | --- | --- | --- |
| First substrate | Fluororesin layer-coated copper foil-8 | Fluororesin layer-coated copper foil-9 | Copper foil-1 | Fluororesin layer-coated copper foil-3 | Fluororesin layer-coated copper foil-3 |
| Second substrate | Polyimide film-2 | Polyimide film-2 | Both side fluororesin film-coated polyimide film-1 | Polyimide film-5 | Polyimide film-6 |
| Third substrate | Fluororesin layer-coated copper foil-8 | Fluororesin layer-coated copper foil-9 | Copper foil-1 | Fluororesin layer-coated copper foil-3 | Fluororesin layer-coated copper foil-3 |
| Total thickness T1 (μm) of fluororesin layer | 10 | 10 | 10 | 20 | 20 |
| Total thickness T2 (μm) of heat-resistant resin layer | 12.5 | 12.5 | 12.5 | 25 | 25 |
| T1/T2 | 0.8 | 0.8 | 0.8 | 0.8 | 0.8 |
| T1 + T2 (μm) | 22.5 | 22.5 | 22.5 | 45 | 45 |
| Adhesive strength (N/cm) | 15 | 15 | 10 | 15 | 15 |
| Dimensional change (%) | −0.03 | −0.03 | −0.03 | −0.03 | −0.03 |
| Relative permittivity | 2.7 | 2.7 | 2.7 | 2.7 | 2.7 |
| Folding endurance (number of times) | >100000 | >100000 | >100000 | 50000 | 50000 |
| Bubbles | ◯ | ◯ | ◯ | ◯ | ◯ |
| Proportion of dispersing agent (mass %) | 0.5 | 0.5 | 0.5 | 0.5 | 0.5 |

TABLE 6

|  | Ex. 16 | Ex. 17 | Ex. 18 | Ex. 19 | Ex. 10 |
|---|---|---|---|---|---|
| First substrate | Fluororesin layer-coated copper foil-3 | Fluororesin layer-coated copper foil-3 | Fluororesin layer-coated copper foil-2 | Fluororesin layer-coated copper foil-3 | Fluororesin layer-coated copper foil-3 |
| Second substrate | Polyimide film-1 | Polyimide film-4 | Polyimide film-3 | Polyimide film-7 | Polyimide film-8 |
| Third substrate | Fluororesin layer-coated copper foil-3 | Fluororesin layer-coated copper foil-3 | Fluororesin layer-coated copper foil-2 | Fluororesin layer-coated copper foil-3 | Fluororesin layer-coated copper foil-3 |
| Total thickness T1 (μm) of fluororesin layer | 20 | 20 | 4 | 20 | 20 |
| Total thickness T2 (μm) of heat-resistant resin layer | 5 | 50 | 25 | 25 | 25 |
| T1/T2 | 4 | 0.4 | 0.16 | 0.8 | 0.8 |
| T1 + T2 (μm) | 25 | 70 | 29 | 45 | 45 |
| Adhesive strength (N/cm) | 12 | 12 | 12 | 18 | 20 |
| Dimensional change (%) | −0.3 | −0.01 | −0.01 | −0.03 | −0.03 |
| Relative permittivity | 2.2 | 3.1 | 3.6 | 2.7 | 2.7 |
| Folding endurance (number of times) | >100000 | 5000 | >100000 | 50000 | 50000 |
| Bubbles | ○ | ○ | ○ | ○ | ○ |
| Proportion of dispersing agent (mass %) | 0.5 | 0.5 | 0.5 | 0.5 | 0.5 |

(Ex. 21 to Ex. 22)

A long laminate was obtained in the same manner as in Ex. 1, except that the first substrate, the second substrate and the third substrate were changed as shown in Table 7. The results are shown in Table 7.

TABLE 7

|  | Ex. 21 | Ex. 22 |
|---|---|---|
| First substrate | Fluororesin layer-coated copper foil-9 | Fluororesin layer-coated copper foil-3 |
| Second substrate | Liquid crystal polymer film 1 | Liquid crystal polymer film 2 |
| Third substrate | Fluororesin layer-coated copper foil-9 | Fluororesin layer-coated copper foil-3 |
| Total thickness T1 (μm) of fluororesin layer | 20 | 20 |
| Total thickness T2 (μm) of heat-resistant resin layer | 25 | 25 |
| T1/T2 | 0.8 | 0.8 |
| T1 + T2 (μm) | 45 | 45 |
| Adhesive strength (N/cm) | 10 | 10 |
| Dimensional change (%) | −0.03 | −0.03 |
| Relative permittivity | 2.7 | 2.7 |
| Folding endurance (number of times) | 50000 | 50000 |
| Bubbles | ○ | ○ |
| Proportion of dispersing agent (mass %) | 0.5 | 0.5 |

In Ex. 16, the total thickness of the fluororesin layer was 4 times the total thickness of the heat-resistant resin layer, whereby the dimensional stability of the long laminate was significantly poor at a level of −0.3%.

In Ex. 17, the sum of the total thickness of the fluororesin layer and the total thickness of the heat-resistant resin layer was 70 μm, whereby the folding endurance of the long laminate was significantly poor at a level of 5,000 times.

In Ex. 18, the total thickness of the fluororesin layer was 0.16 times the total thickness of the heat-resistant resin layer, whereby the relative permittivity was significantly poor at a level of 3.6.

INDUSTRIAL APPLICABILITY

The long laminate of the present invention is useful as a material for a flexible printed wiring board.

This application is a continuation of PCT Application No. PCT/JP2019/000948 filed on Jan. 15, 2019, which is based upon and claims the benefit of priority from Japanese Patent Application No. 2018-006772 filed on Jan. 18, 2018, Japanese Patent Application No. 2018-078253 filed on Apr. 16, 2018 and Japanese Patent Application No. 2018-163696 filed on Aug. 31, 2018. The contents of those applications are incorporated herein by reference in their entireties.

REFERENCE SYMBOLS

1: apparatus, 2: heat lamination machine, 2': heat lamination machine, 10: long laminate, 10': protective layer-coated long laminate, 12: metal layer, 14: fluororesin layer, 16: heat-resistant resin layer, 20: unwinding roll, 22: die coater, 24: drying device, 26: firing device, 28: winding roll, 30: guide roll, 32: die back roll, 34: guide roll, 36: guide roll, 40: first unwinding roll, 41: fourth unwinding roll, 42: second unwinding roll, 43: fifth unwinding roll, 44: third unwinding roll, 46: metal roll, 48: winding roll, 50: guide roll, 50': guide roll, 51: guide roll, 52: guide roll, 53: guide roll, 54: guide roll, 54': guide roll, 56: guide roll, 100: metal foil or heat-resistant resin film, 102: wet film-coated metal foil or heat-resistant resin film, 104: dried film-coated metal foil or heat-resistant resin film, 106: fluororesin layer-coated metal foil or a heat-resistant resin film, 200: first substrate, 202: second substrate, 204: third substrate, 206: fourth substrate, 208: fifth substrate.

What is claimed is:

1. A long laminate, comprising
at least one metal layer made of a long metal foil,
at least one fluororesin layer in contact with the metal layer, and
at least one heat-resistant resin layer in contact with the fluororesin layer,
wherein
the fluororesin layer contains a dispersing agent in a proportion of 0.1 mass % to 2.0 mass % relative to a total mass of the fluororesin layer,
each fluororesin layer has a thickness of from 1 to 10 μm,
a ratio of a total thickness of the fluororesin layer to a total thickness of the heat-resistant resin layer is from 0.3 to 3.0, and a total thickness of the fluororesin layer and the heat-resistant resin layer is at most 50 μm.

2. The long laminate according to claim 1, wherein the fluororesin layer is composed mainly of a fluororesin.

3. The long laminate according to claim 2, wherein the fluororesin has a melting point of at least 270° C.

4. The long laminate according to claim 2, wherein the fluororesin has at least one functional group selected from the group consisting of a carbonyl group-containing group, a hydroxy group, an epoxy group, an amide group, an amino group, and an isocyanate group.

5. The long laminate according to claim 1, wherein the proportion of the dispersing agent contained in the fluororesin layer is from 0.1 mass % to 1.0 mass % relative to the total mass of the fluororesin layer.

6. The long laminate according to claim 1, wherein the total thickness of the fluororesin layer and the heat-resistant resin layer is at most 25 μm.

7. A printed wiring board made by processing the long laminate according to claim 1.

8. The long laminate according to claim 1, wherein the heat-resistant resin layer contains a heat-resistant resin, which is at least one selected from the group consisting of a polyarylate, a polysulfone, a polyallyl sulfone, an aromatic polyamide, an aromatic polyether amide, a polyphenylene sulfide, a polyallyl ether ketone, a polyamideimide, a liquid crystal polyester, and a liquid crystal polyester amide.

9. The long laminate according to claim 8, wherein the heat-resistant resin is at least one of a liquid crystal polyester and a liquid crystal polyester amide.

\* \* \* \* \*